US010452297B1

(12) United States Patent
Karr et al.

(10) Patent No.: US 10,452,297 B1
(45) Date of Patent: Oct. 22, 2019

(54) GENERATING AND OPTIMIZING SUMMARY INDEX LEVELS IN A DEDUPLICATION STORAGE SYSTEM

(71) Applicant: Pure Storage, Inc., Mountain View, CA (US)

(72) Inventors: Ronald Karr, Palo Alto, CA (US); Ethan L. Miller, Santa Cruz, CA (US); Cary A. Sandvig, Palo Alto, CA (US); Feng Wang, Sunnyvale, CA (US); Wei Zhang, Santa Clara, CA (US)

(73) Assignee: Pure Storage, Inc., Mountain View, CA (US)

(*) Notice: Subject to any disclaimer, the term of this patent is extended or adjusted under 35 U.S.C. 154(b) by 158 days.

(21) Appl. No.: 15/339,684

(22) Filed: Oct. 31, 2016

Related U.S. Application Data

(60) Provisional application No. 62/330,716, filed on May 2, 2016, provisional application No. 62/330,733, filed on May 2, 2016.

(51) Int. Cl.
*G06F 3/06* (2006.01)
(52) U.S. Cl.
CPC .......... *G06F 3/0641* (2013.01); *G06F 3/0608* (2013.01); *G06F 3/0685* (2013.01)
(58) Field of Classification Search
None
See application file for complete search history.

(56) References Cited

U.S. PATENT DOCUMENTS

| | | | |
|---|---|---|---|
| 5,208,813 | A | 5/1993 | Stallmo |
| 5,403,639 | A | 4/1995 | Belsan |
| 5,940,838 | A | 8/1999 | Schmuck et al. |
| 6,263,350 | B1 | 7/2001 | Wollrath et al. |
| 6,286,056 | B1 | 9/2001 | Edgar et al. |
| 6,412,045 | B1 | 6/2002 | DeKoning et al. |
| 6,718,448 | B1 | 4/2004 | Ofer |
| 6,757,769 | B1 | 6/2004 | Ofer |

(Continued)

FOREIGN PATENT DOCUMENTS

| | | |
|---|---|---|
| CN | 103370685 A | 10/2013 |
| CN | 103370686 A | 10/2013 |

(Continued)

OTHER PUBLICATIONS

Ouyang, J. et al. (Mar. 1-5, 2014) "SDF: Software-Defined Flash for Web-Scale Internet Storage Systems", ASPLOS 2014, 14 pages.

(Continued)

*Primary Examiner* — Tracy C. Chan
(74) *Attorney, Agent, or Firm* — Womble Bond Dickinson (US) LLP; Daniel E. Ovanezian

(57) ABSTRACT

The method and system generates a first deduplication map (DDM) level including first data and a second DDM level including second data. The method or apparatus also generates a first index summary (IS) level corresponding to the first DDM level and a second IS level corresponding to the second DDM level. The method or apparatus merges the first data of the first DDM level and the second data of the second DDM level to generate a third DDM level comprising third data. The method or apparatus in response to generating the third DDM level, generates a third IS level to accelerate lookup within the third DDM level.

20 Claims, 8 Drawing Sheets

(56) References Cited

U.S. PATENT DOCUMENTS

| | | |
|---|---|---|
| 6,799,283 B1 | 9/2004 | Tamai et al. |
| 6,804,703 B1 | 10/2004 | Allen et al. |
| 6,834,298 B1 | 12/2004 | Singer et al. |
| 6,850,938 B1 | 2/2005 | Sadjadi |
| 6,915,434 B1 | 7/2005 | Kuroda |
| 6,954,881 B1 | 10/2005 | Flynn, Jr. et al. |
| 6,973,549 B1 | 12/2005 | Testardi |
| 7,028,216 B2 | 4/2006 | Aizawa et al. |
| 7,028,218 B2 | 4/2006 | Schwarm et al. |
| 7,039,827 B2 | 5/2006 | Meyer et al. |
| 7,139,907 B2 | 11/2006 | Bakke et al. |
| 7,216,164 B1 | 5/2007 | Whitmore et al. |
| 7,272,674 B1 | 9/2007 | Nandi et al. |
| 7,313,636 B2 | 12/2007 | Qi |
| 7,577,802 B1 | 8/2009 | Parsons |
| 7,783,682 B1 | 8/2010 | Patterson |
| 7,873,619 B1 | 1/2011 | Faibish et al. |
| 7,913,300 B1 | 3/2011 | Flank et al. |
| 7,933,936 B2 | 4/2011 | Aggarwal et al. |
| 7,979,613 B2 | 7/2011 | Zohar et al. |
| 8,086,652 B1 | 12/2011 | Bisson et al. |
| 8,103,754 B1 | 1/2012 | Luong et al. |
| 8,117,464 B1 | 2/2012 | Kogelnik |
| 8,200,887 B2 | 6/2012 | Bennett |
| 8,205,065 B2 | 6/2012 | Matze |
| 8,301,811 B1 | 10/2012 | Wigmore et al. |
| 8,352,540 B2 | 1/2013 | Anglin et al. |
| 8,370,315 B1* | 2/2013 | Efstathopoulos ... G06F 17/3015 707/696 |
| 8,527,544 B1* | 9/2013 | Colgrove ............ G06F 3/0608 707/791 |
| 8,560,747 B1 | 10/2013 | Tan et al. |
| 8,621,241 B1 | 12/2013 | Stephenson |
| 8,645,649 B2 | 2/2014 | Kaiya et al. |
| 8,700,875 B1 | 4/2014 | Barron et al. |
| 8,751,463 B1 | 6/2014 | Chamness |
| 8,806,160 B2 | 8/2014 | Colgrove et al. |
| 8,874,850 B1 | 10/2014 | Goodson et al. |
| 8,959,305 B1 | 2/2015 | Lecrone et al. |
| 9,063,937 B2 | 6/2015 | McDowell et al. |
| 9,081,713 B1 | 7/2015 | Bennett |
| 9,189,334 B2 | 11/2015 | Bennett |
| 9,294,567 B2 | 3/2016 | Hussain et al. |
| 9,311,182 B2 | 4/2016 | Bennett |
| 9,423,967 B2 | 8/2016 | Colgrove et al. |
| 9,430,412 B2 | 8/2016 | Huang |
| 9,436,396 B2 | 9/2016 | Colgrove et al. |
| 9,436,720 B2 | 9/2016 | Colgrove et al. |
| 9,454,476 B2 | 9/2016 | Colgrove et al. |
| 9,454,477 B2 | 9/2016 | Colgrove et al. |
| 9,501,245 B2 | 11/2016 | Hussain et al. |
| 9,513,820 B1 | 12/2016 | Shalev |
| 9,516,016 B2 | 12/2016 | Colgrove et al. |
| 9,552,248 B2 | 1/2017 | Miller et al. |
| 9,565,269 B2 | 2/2017 | Malwankar et al. |
| 9,632,870 B2 | 4/2017 | Bennett |
| 2002/0038436 A1 | 3/2002 | Suzuki |
| 2002/0087544 A1 | 7/2002 | Selkirk et al. |
| 2002/0178335 A1 | 11/2002 | Selkirk et al. |
| 2003/0140209 A1 | 7/2003 | Testardi |
| 2004/0049572 A1 | 3/2004 | Yamamoto et al. |
| 2005/0066095 A1 | 3/2005 | Mullick et al. |
| 2005/0216535 A1 | 9/2005 | Saika et al. |
| 2005/0223154 A1 | 10/2005 | Uemura |
| 2006/0074940 A1 | 4/2006 | Craft et al. |
| 2006/0136365 A1 | 6/2006 | Kedem et al. |
| 2006/0155946 A1 | 7/2006 | Ji |
| 2007/0067585 A1 | 3/2007 | Ueda et al. |
| 2007/0109856 A1 | 5/2007 | Pellicone et al. |
| 2007/0162954 A1 | 7/2007 | Pela |
| 2007/0171562 A1 | 7/2007 | Maejima et al. |
| 2007/0174673 A1 | 7/2007 | Kawaguchi et al. |
| 2007/0220313 A1 | 9/2007 | Katsuragi et al. |
| 2007/0245090 A1 | 10/2007 | King et al. |
| 2007/0266179 A1 | 11/2007 | Chavan et al. |
| 2008/0034167 A1 | 2/2008 | Sharma et al. |
| 2008/0059699 A1 | 3/2008 | Kubo et al. |
| 2008/0065852 A1 | 3/2008 | Moore et al. |
| 2008/0134174 A1 | 6/2008 | Sheu et al. |
| 2008/0155191 A1 | 6/2008 | Anderson et al. |
| 2008/0178040 A1 | 7/2008 | Kobayashi |
| 2008/0209096 A1 | 8/2008 | Lin et al. |
| 2008/0244205 A1 | 10/2008 | Amano et al. |
| 2008/0275928 A1 | 11/2008 | Shuster |
| 2008/0282045 A1 | 11/2008 | Biswas et al. |
| 2008/0285083 A1 | 11/2008 | Aonuma |
| 2008/0307270 A1 | 12/2008 | Li |
| 2009/0006587 A1 | 1/2009 | Richter |
| 2009/0037662 A1 | 2/2009 | La Frese et al. |
| 2009/0204858 A1 | 8/2009 | Kawaba |
| 2009/0228648 A1 | 9/2009 | Wack |
| 2009/0300084 A1 | 12/2009 | Whitehouse |
| 2010/0057673 A1 | 3/2010 | Savov |
| 2010/0058026 A1 | 3/2010 | Heil et al. |
| 2010/0067706 A1 | 3/2010 | Anan et al. |
| 2010/0077205 A1 | 3/2010 | Ekstrom et al. |
| 2010/0082879 A1 | 4/2010 | McKean et al. |
| 2010/0106905 A1 | 4/2010 | Kurashige et al. |
| 2010/0153620 A1 | 6/2010 | McKean et al. |
| 2010/0153641 A1 | 6/2010 | Jagadish et al. |
| 2010/0191897 A1 | 7/2010 | Zhang et al. |
| 2010/0250802 A1 | 9/2010 | Waugh et al. |
| 2010/0250882 A1 | 9/2010 | Hutchison et al. |
| 2010/0269024 A1* | 10/2010 | Hao ...................... H03M 13/13 714/777 |
| 2010/0281225 A1 | 11/2010 | Chen et al. |
| 2010/0287327 A1 | 11/2010 | Li et al. |
| 2011/0072300 A1 | 3/2011 | Rousseau |
| 2011/0121231 A1 | 6/2011 | Haas et al. |
| 2011/0145598 A1 | 6/2011 | Smith et al. |
| 2011/0161559 A1 | 6/2011 | Yurzola et al. |
| 2011/0167221 A1 | 7/2011 | Pangal et al. |
| 2011/0238634 A1 | 9/2011 | Kobara |
| 2012/0023375 A1 | 1/2012 | Dutta et al. |
| 2012/0036309 A1 | 2/2012 | Dillow et al. |
| 2012/0117029 A1 | 5/2012 | Gold |
| 2012/0198175 A1 | 8/2012 | Atkisson |
| 2012/0310960 A1* | 12/2012 | Watanabe ......... G06F 17/30946 707/756 |
| 2012/0330954 A1 | 12/2012 | Sivasubramanian et al. |
| 2013/0042052 A1 | 2/2013 | Colgrove et al. |
| 2013/0046995 A1 | 2/2013 | Movshovitz |
| 2013/0047029 A1 | 2/2013 | Ikeuchi et al. |
| 2013/0091102 A1 | 4/2013 | Nayak |
| 2013/0097380 A1* | 4/2013 | Colgrove .......... G06F 17/30159 711/118 |
| 2013/0205110 A1 | 8/2013 | Kettner |
| 2013/0227236 A1 | 8/2013 | Flynn et al. |
| 2013/0275391 A1 | 10/2013 | Batwara et al. |
| 2013/0275656 A1 | 10/2013 | Talagala et al. |
| 2013/0283058 A1 | 10/2013 | Fiske et al. |
| 2013/0290648 A1 | 10/2013 | Shao et al. |
| 2013/0318314 A1 | 11/2013 | Markus et al. |
| 2013/0325821 A1* | 12/2013 | Amit ................ G06F 17/30159 707/692 |
| 2013/0339303 A1 | 12/2013 | Potter et al. |
| 2014/0052946 A1 | 2/2014 | Kimmel |
| 2014/0068791 A1 | 3/2014 | Resch |
| 2014/0089730 A1 | 3/2014 | Watanabe et al. |
| 2014/0101361 A1 | 4/2014 | Gschwind |
| 2014/0143517 A1 | 5/2014 | Jin et al. |
| 2014/0172929 A1 | 6/2014 | Sedayao et al. |
| 2014/0201150 A1 | 7/2014 | Kumarasamy et al. |
| 2014/0215129 A1 | 7/2014 | Kuzmin |
| 2014/0229131 A1 | 8/2014 | Cohen et al. |
| 2014/0229452 A1 | 8/2014 | Serita et al. |
| 2014/0281308 A1 | 9/2014 | Lango et al. |
| 2014/0310476 A1* | 10/2014 | Kruus ................ G06F 12/0871 711/133 |
| 2014/0325115 A1 | 10/2014 | Ramsundar et al. |
| 2015/0019798 A1 | 1/2015 | Huang |
| 2015/0234709 A1 | 8/2015 | Koarashi |
| 2015/0244775 A1 | 8/2015 | Vibhor et al. |
| 2015/0278534 A1 | 10/2015 | Thiyagarajan et al. |

(56) References Cited

U.S. PATENT DOCUMENTS

| | | | |
|---|---|---|---|
| 2016/0019114 A1 | 1/2016 | Han et al. | |
| 2016/0026652 A1* | 1/2016 | Zheng | G06F 17/30159 |
| | | | 707/692 |
| 2016/0098191 A1 | 4/2016 | Golden et al. | |
| 2016/0098199 A1 | 4/2016 | Golden et al. | |
| 2016/0283538 A1* | 9/2016 | Barber | G06F 16/2255 |
| 2017/0024166 A1 | 1/2017 | Singh et al. | |

FOREIGN PATENT DOCUMENTS

| | | |
|---|---|---|
| CN | 104025010 B | 11/2016 |
| EP | 3066610 A1 | 9/2016 |
| EP | 3082047 A1 | 10/2016 |
| EP | 3120235 A | 1/2017 |
| JP | 2007-087036 A | 4/2007 |
| JP | 2007-094472 A | 4/2007 |
| JP | 2008-250667 A | 10/2008 |
| JP | 2010-211681 A | 9/2010 |
| WO | WO-1995/002349 A1 | 1/1995 |
| WO | WO-1999/013403 A1 | 3/1999 |
| WO | WO-2008/102347 A1 | 8/2008 |
| WO | WO-2010/071655 A1 | 6/2010 |

OTHER PUBLICATIONS

Zhang, J. et al. (2016) "Application-Aware and Software-Defined SSD Scheme for Tencent Large-Scale Storage System" 2016 IEEE 22nd International Conference on Parallel and Distributed Systems, 482-490.

"Open-Channel Solid State Drives NVMe Specification" (Apr. 2016), 24 pages.

Microsoft Corporation, "GCSettings.IsServerGC Property", Retrieved Oct. 27, 2013 via the WayBack Machine, 3 pages.

Microsoft Corporation, "Fundamentals of Garbage Collection", Retrieved Aug. 30, 2013 via the WayBack Machine, 11 pages.

\* cited by examiner

GENERATING AND OPTIMIZING SUMMARY INDEX LEVELS IN A DEDUPLICATION STORAGE SYSTEM

RELATED APPLICATIONS

The present application claims the benefit of U.S. Provisional Patent Application No. 62/330,716, filed May 2, 2016, and also claims the benefit of U.S. Provisional Patent Application No. 62/330,733 filed May 2, 2016, all of which are incorporated by reference herein.

BACKGROUND

Data deduplication is a process to eliminate or remove redundant data to improve the utilization of storage resources. For example, during the data deduplication process, blocks of data may be processed and stored. When a subsequent block of data is received, the subsequent block of data may be compared with the previously stored block of data. If the subsequent block of data matches with the previously stored block of data, then the subsequent block of data may not be stored in the storage resource. Instead, a pointer to the previously stored block of data may replace the contents of the subsequent block of data.

BRIEF DESCRIPTION OF THE DRAWINGS

The present disclosure is illustrated by way of example, and not by way of limitation, and can be more fully understood with reference to the following detailed description when considered in connection with the figures as described below.

DETAILED DESCRIPTION

Figure 1:
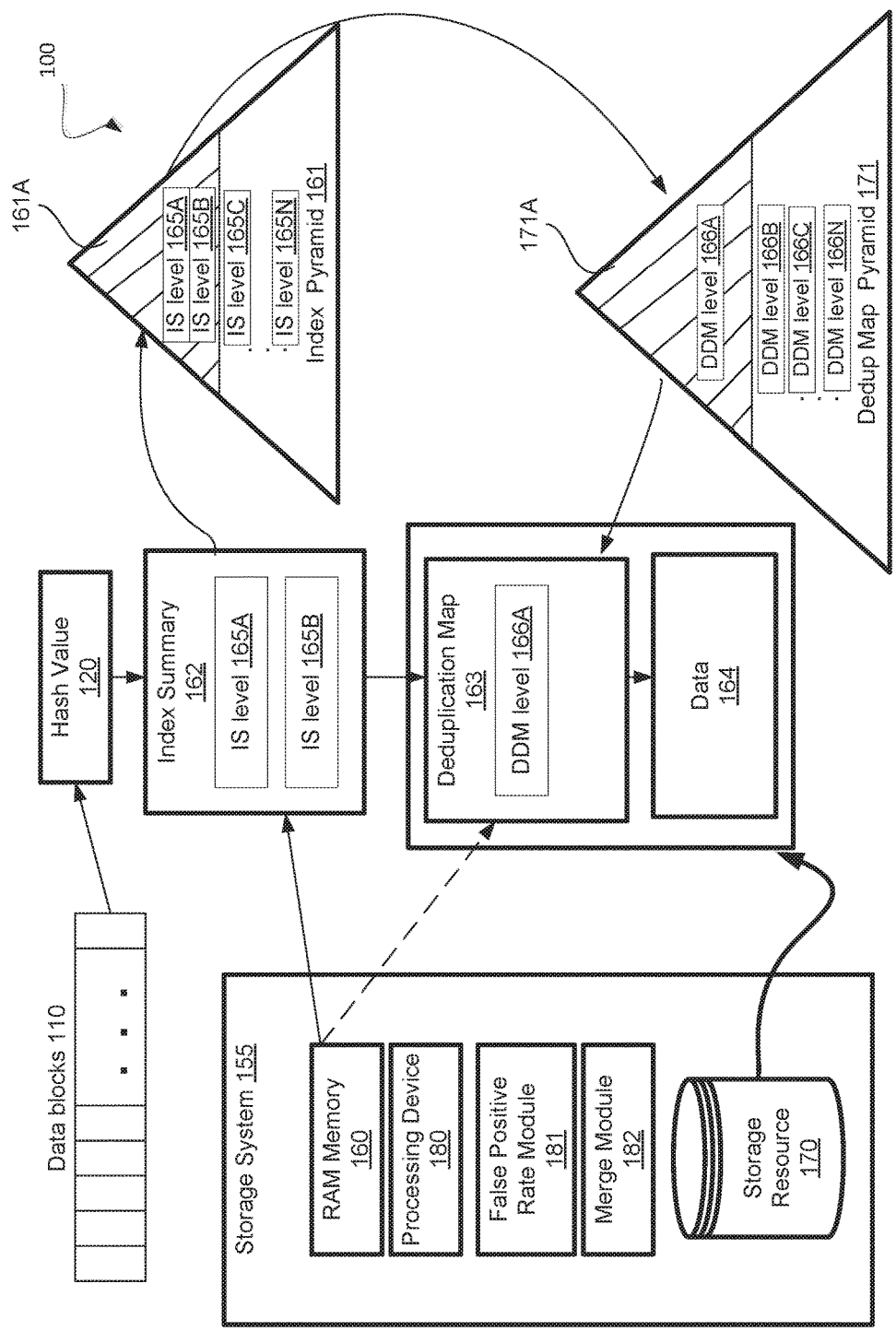
FIG. 1 illustrates an example system architecture for a data deduplication system implementing a false positive rate module and merge module, in accordance with some implementations.

The data deduplication process may include a background data deduplication process and an inline data deduplication process. In background data deduplication (which also may be referred to as "background deduplication" or "post-processing data deduplication" herein), a storage system including any persistent storage resources (which also may be referred to as "storage resources" herein) are scanned to detect duplicate data blocks within the storage system. Background deduplication may occur after data blocks are stored in the storage system. Inline data deduplication (which also may be referred to as "inline deduplication" herein) may be performed as new data blocks are received or prior to storing the received data blocks in a storage resource (e.g., storage resources using solid-state non-volatile memory such as flash), or as part of a process of moving from one storage resource (e.g., a persistent, battery-backed, or capacitor-backed write cache or write staging area) to a second storage resource (e.g., a bulk backing store composed of disk or solid state storage). For example, a data block is received and analyzed before being stored in a storage resource. The inline deduplication process may determine whether a copy of the received data block is already stored in the storage resource before storing the received data block in the storage resource. Thus, the inline deduplication process may be performed as a stream of data blocks is received prior to being stored in the storage resource.

As data blocks are received by a data deduplication system (which also may be referred to as a "deduplication system" herein), data stored in volatile memory (e.g., cache memory) may be used to help accelerate the detection of received data blocks that are already stored in the persistent storage resource. For instance, rather than comparing a hash value of a received data block to all the hash values in a data deduplication system, where the hash values in a data deduplication system represent data blocks already stored in the persistent storage resource, a data deduplication system may implement index-like and table-like data structures to improve efficiency. For example, a data deduplication system may implement index summary levels and deduplication map levels, for groups of stored hash values and location pointers that were generated at roughly similar points in time or from some similar natural grouping, that are stored in volatile memory or a persistent storage resource and that may be used to efficiently determine if the received data block is currently stored in the persistent storage resource without comparing a hash value of a received data block to all the hash values in a data deduplication system.

As the number of data blocks stored in the persistent storage resource increases, the number of the index summary levels and deduplication map levels also increases. At some point, the number of deduplication map levels and index summary levels becomes so numerous as to impact data deduplication. For instance, as the number of deduplication map levels increases, an increasing number of deduplication map levels may be searched to find a hash value of a received data block, which may impact computational resources, memory and storage resources, or the efficacy of data deduplication.

In some examples, an index summary level helps accelerate lookup for a value in a corresponding deduplication map level. Lookup in a deduplication map level using an index summary level may not be definitive and may yield false positives for whether a particular value is actually associated with the deduplication map level. In some systems, the false positive rate for index summary levels may not vary from one index summary level to another index summary level, which may introduce significant challenges to data deduplication systems. For instance, the false positive rates of index summary levels may be controlled by the amount of information an index summary level contains. The size of index summary levels may be large and have low false positive rates, but may be so large as to negatively impact computational resources, memory and storage resources, or the efficacy of data deduplication. The size of index summary levels may be small and have higher false positive rates, but the aggregate false positive rate of all the index summary levels may be too high and negatively impact data deduplication.

Aspects of the present disclosure address the above-mentioned and other deficiencies by decreasing the total number of deduplication map levels by merging deduplication map levels and generating new corresponding index summary levels to accelerate lookup into the merged deduplication map levels. Aspects of the present disclosure further address the above-mentioned and other deficiencies of non-varying false positive rates by generating index summary levels having varying false positive rates, where the false positive rates of individual index summary levels may be determined based on a memory footprint for an index summary level and a correlated aggregate false positive rate for multiple index summary levels in an index pyramid.

In one implementation, a first deduplication map level and corresponding first index summary level, and a second deduplication map level and corresponding second index summary level are generated. The first index summary level accelerates lookup in the first deduplication map level, and the second index summary level accelerates lookup in the second deduplication map level. The first deduplication map level and the second deduplication map level may be merged, in a processes also referred to as "flattening" herein, into a single deduplication map level (e.g., merged deduplication map level). Duplicate entries between the first and second deduplication map levels may be discarded. In response to generating the merged deduplication map level, a new index summary level corresponding to the merged deduplication map level may be generated. The first and second deduplication map levels and first and second index summary levels may then be discarded or subsequently ignored for lookup or caching purposes. In some implementations, generating a new index summary level presents an opportunity to tune the parameters and to adjust the false positive rate of the new index summary level. The false positive rate of the new index summary level may be adjusted based on a memory footprint of the new index summary level and a correlated aggregate false positive rate target for all the index summary levels in a storage system.

"False positive rate" may refer to a percentage of queries into a data structure (e.g., index summary level) for data located in another data structure (e.g., deduplication map level) that incorrectly yield a hit. A "hit" may refer to finding queried data in a particular data structure (e.g., index summary level). An "aggregate false positive rate" may refer to an aggregate of the multiple false positive rates, such as the aggregate of false positive rates for multiple index summary levels of index pyramid. Index summary structures that generate a lower false positive rate for lookups may use more memory, with the particular correlation depending on the specific data structures used by the implementation.

Accordingly, aspects of the present disclosure allow for a data deduplication system to selectively generate new index summary levels based on merged deduplication map levels, and generated index summary levels with varying false positive rates and varying associated index summary level overheads, while maintaining a high level of efficacy of data deduplication.

FIG. 1 illustrates an example system architecture for data deduplication system 100 implementing a false positive rate module 181 and a merge module 182, in accordance with some implementations. Storage system 155 may include a volatile memory 160, a persistent storage resource 170, a processing device 180, a false positive rate module 181, and a merge module 182. Processing device 180 may execute the false positive rate module 181 or merge module 182. It may be noted that for purposes of illustration false positive rate module 181 and merge module 182 are shown as two modules. In some implementations, false positive rate module 181 and merge module 182 may be a single module or multiple modules. It may be noted that the functionality attributed to a particular element may be performed by different or multiple elements operating together.

In one implementation, the persistent storage resource 170 may correspond to non-disk storage media. For example, the persistent storage resource 170 may be one or more solid-state drives (SSDs), flash memory based storage, any type of solid-state non-volatile memory, or any other type of non-mechanical storage device. In some implementations, the persistent storage resource 170 may be a storage device that includes flash memory. Volatile memory 160 (also referred to as "cache" or "cache memory" herein) may include random access memory (RAM) such as dynamic RAM (DRAM), or static RAM (SRAM), or on-chip cache RAM of processing device 180. In other examples, volatile memory 160 may be virtual memory or cache-managed memory that is transferred on demand between RAM and local high-speed solid state memory such as Flash (e.g., single level cell (SLC) Flash).

In one implementation, the storage system 155 may receive data blocks 110 and store the data blocks 110 in the persistent storage resource 170 after performing an inline deduplication process. The inline deduplication process may use the index summary 162 and the deduplication map 163 to determine whether the persistent storage resource 170 currently stores data 164 that includes a copy of received data blocks 110. The index summary 162 may be stored in volatile memory 160 and may include index summary levels 165A-165B that correspond to data blocks more recently received by the storage system 155. Index summary levels 165 may include partial values (e.g., partial hash values) and may accelerate lookup of complete values in the corresponding deduplication map levels 166. The deduplication map 163 may be stored in volatile memory 160 and may include deduplication map level 166A that also corresponds to data blocks more recently received by the storage system 155. Deduplication map levels 166 may include complete values (e.g., complete hash values) for the data 164 currently stored in the persistent storage resource 170 and point to locations in storage resource 170 where specific data blocks of data 164 are stored. It may be noted that for purposes of illustration and simplicity, rather than limitation, partial hash value is used as an example of partial values and complete hash value (also referred to as "hash value" herein) is used as an example of complete values (also referred to as "value" herein).

In one implementation, a stream of data blocks 110 may be received from, for example, a client device (not shown). A transformation component (not shown) may use the stream of data blocks 110 in a hash function to generate one or more hash values 120. The hash function may transform the data blocks 110 of an arbitrary size to data of a fixed size, such as 128-bit. In some implementations, the stream of data blocks 110 may be a series of data blocks that are to be stored at storage resources 170 managed by the storage system 155. The transformation component may perform a transformation using for example, a hash function, on each data block of the stream of data blocks 110 to generate corresponding hash values 120 before determining whether to store the data blocks 110 at the persistent storage resource 170. If the corresponding hash values 120 match previously stored hash values, the contents of the data blocks 110 may be a copy of previously received data blocks. Instead of storing the data blocks 110, a pointer to the previously received data blocks with the matching hash values may be used.

In one implementation, a deterministic transformation function may be a 128-bit or higher hash function that generates a hash value that is of a size equal to or greater than 128-bit (e.g., a strong hash value). Examples of a deterministic transformation function include, but are not limited to, a Secure Hash Algorithm (SHA) such as SHA-1 or SHA-2. "Deterministic" (e.g., 128-bit or more hash value) used herein may be considered sufficient to rely on a "practical" rather than a theoretical guarantee of non-collision, in cases where the implementation chooses to rely only on the hash value and does not follow up with a data compare. A deterministic hash function for all practical purposes ensures that a specific result deterministically ensures the hash function was given the same input. The use of a properly chosen "deterministic" hash function can be "deterministically" certain, within the bounds of statistical probabilities, that only the same input values, e.g., an identical stream of data between 512 bytes and 32 kilobytes, will result in the same output value if that value is at least 128 bits. Whereas, no similar hash function generating a result much smaller than 128 bits (e.g., 100 bits or less) can reasonably ensure that an identical output value deterministically ensures that the input data was the same. As such, a match between hash values of two data blocks generated by the deterministic hash function may positively identify (at least practically) that the two data blocks are copies of each other, and thus the contents of the data block that is subsequently received may be replaced with a pointer to the other data block. It may be appreciated that the hash value may be any number of bits and may be determined by implementation trade-offs and considerations, among other factors.

In one implementation, the resulting hash values 120 may be compared with other hash values stored in index summary levels 165 of the index summary 162 in volatile memory 160 to determine whether a copy of the data blocks 110 is currently stored in the persistent storage resource 170. The hash values stored in index summary 162 may be partial hash values of for example, 40-50 bits. It may be noted that in some implementations, such as implementations where varying false positive rates are determined, index summary 162 may be or include a Bloom filter. In some implementations, a Bloom filter may refer to a data structure that is used to test whether an element is a member of a set. In a Bloom filter, false positive matches are possible, but false negatives are not. In one implementation, if the hash values 120 are not found in index summary 162, the storage system 155 determines that the stream of data blocks 110 have not been previously stored and stores those data blocks 110 in persistent storage resource 170. If the hash values 120 are found in an index summary level 165 of the index summary 162, storage system 155 checks a page in a corresponding deduplication map level 166 to find the complete hash values, such as the 128-bit hash value, and the physical location of the data 164. In some implementations, if the hash values 120 are found in corresponding deduplication map level 166, the storage system 155 determines that blocks identical to data blocks 110 are already stored in persistent storage resource 170 and does not store data blocks 110.

A deduplication map 163 may include one or more deduplication map levels 166. A deduplication map level 166 may refer to a data structure, such as a table with rows (also referred to as "entries" herein). The data of a deduplication map level 166 may be evenly distributed. The rows may define a value (also referred to as a "key" or "complete value" herein), such as a complete hash value (also referred to as a "hash value" herein), for a data block. The row may also identify a location of the data block (also referred to as a "value" of a key-value pair), such as an address in the persistent storage resource 170. The deduplication map level 166 may be sorted by value (e.g., key) and held in volatile memory 160 or stored in pages of persistent storage resource 170 in some grouping, segmenting, or vectoring that orders and relates the portions of the pages of the deduplication map level 166 together in an efficient manner. In some implementations, a page may be a smallest unit of memory that may be programmed (e.g., written to) in the persistent storage resource 170.

In some implementations, a single evenly distributed value may be approximately equally likely to be in any fixed-width range of the potential values. This is similar to a uniform distribution, but there is no requirement that the value be exactly uniformly distributed. Even with a uniform distribution, some ranges may have more values than others, and that values need not be precisely uniformly distributed across the range. In some implementations, evenly distributed may refer to the statistical likelihood that the generated hash value (e.g., keys) for an input text is the same between any two equally distant values. Given a sufficiently large population of hash values, there may be no biased tendency toward any sub-ranges of values, nor may there by any biased tendency toward any particular bit patterns. As a result, if a sufficiently large population of hash values are sorted into equal size hash value range buckets or equal sized bit pattern subsets, the number of values sorted into each bucket or subset may be roughly the same. For example, if a 128-bit hash value space is divided into 65536 buckets, based on the first 16 bits of the hash value space (or a specific middle 16 bits, or the last 16 bits, for example), then a large population of different generated hash values (much, much larger than 65536) may result in similar numbers of those different generated hash values being assigned to each of those buckets. Statistically random variation in actual hash values may arbitrarily deviate from these expectations, but algorithms may be chosen such that this is unlikely.

For purpose of illustration, deduplication map 163 illustrates the deduplication map levels (e.g., deduplication map level 166A) stored in volatile memory 160 of storage system 155. It may be noted that some, all, or none of the deduplication map levels 166 may be stored in volatile memory 160. In some implementations, the deduplication map levels 166 stored in volatile memory 160 or a persistent storage resource 170 may change or otherwise be altered.

In some implementations, a deduplication map pyramid 171 may refer to a specific layering of multiple data structures, such as deduplication map levels 166. A layer or level of the deduplication map pyramid 171 may refer to a specific deduplication map level 166. The deduplication map pyramid 171 may include the aggregate of all deduplication map levels 166 associated with storage system 155 and stored in persistent storage resource 170. In some implementations, newer entries may be stored at higher levels of the deduplication map pyramid 171, and older entries may be stored at lower levels of the deduplication map pyramid 171. The highest entry or group of highest entries may be referred to as the "top" of the deduplication map pyramid 171 (e.g., entries in top index summary level 165A or index summary levels 165A-B). The lowest entry or group of lowest entries may be referred to as the "bottom" of the deduplication map pyramid 171. In some implementations, levels of deduplication map pyramid 171 have a logical sort-merge relationship, where a specific key may reside at any of one or more levels in the deduplication map pyramid 171. Some or all the levels of the deduplication map pyramid 171 may be searched to perform a lookup operation for a specific key in the deduplication map pyramid 171. In some implementations, a key found in a higher level of deduplication map pyramid 171 takes precedence over an identical key found at a lower level of the deduplication map pyramid 171. In some implementations, discard techniques may be implemented to logically discard entries of the deduplication map pyramid 171 in response to, for example, the physical blocks or logical volume or file content associated with the locations in persistent storage resource 170 for some entries having been overwritten, deleted, or moved. It may be noted that as newer deduplication map 163 levels are generated and form a new top of the deduplication map pyramid 171, older deduplication map levels 166 percolate towards the bottom of the deduplication map pyramid 171.

In some implementations, the temporal order (e.g., newest to oldest) of deduplication map levels 166 may be determined by a time order of writes of data blocks to persistent storage resource 170. It may be noted that deduplication map levels 166 (e.g., entries of) may be derived from data blocks stored in persistent storage resource 170. The writes of data blocks to persistent storage resource 170 may be responsive to inline deduplication (e.g., a stream of data blocks received by a user is found in inline data deduplication) or background data deduplication (e.g., a data block is stored in the persistent storage resource 170 and is later checked against other data blocks in persistent storage resource 170 to effect data deduplication). In some implementations, as data 164 is written into persistent storage resource 170, a time identifier, such as a unique sequence number in a monotonic sequence, may be associated with written data. The temporal order of the data 164 stored in persistent storage resource 170, and the temporal order of deduplication map levels 166 derived from the data 164, may be determined from the unique sequence number. In other implementations, the temporal order of deduplication map levels 166 may be determined by a time order of deduplication of data blocks (e.g., data blocks found to be duplicate) found using background deduplication. A time identifier, similar as described above, may be associated to the deduplicated data blocks and used to determine the temporal order of the data block. It may be noted that the temporal order of deduplication map levels 166 may be determined by a time order of writes or a time order of deduplication in background deduplication or a combination of both, in some implementations.

In one implementation, an index summary 162 may include one or more index summary levels 165. An index summary level 165 may correspond to a particular deduplication map level 166, and may at least in part be derived from the associated deduplication map level 166 or the data 164 associated with the deduplication map level 166. An index summary level 165 may refer to a data structure that accelerates lookup into a deduplication map level 166 by indicating a part of a value (e.g., 2 or more bits of the key) located in the deduplication map level 166 or by providing an indication of the location of the value (e.g., key) in the deduplication map level 166. The index summary level 165 may contain a partial value that is or may derive a part of a value (e.g., key) located in the deduplication map level 166. The index summary level 165 may rely on the partial value, such as a partial hash value, to lookup the corresponding value (e.g., complete hash value) in the deduplication map level 166. In some implementations, by using a partial value, lookup in the deduplication map level 166 using the index summary level 165 may not be definitive and may yield false positives for whether a particular value (e.g., key) is actually associated with the deduplication map level 166. If a lookup of a value (e.g., key) for a received data block 110 in the deduplication map level 166 does not match a partial value in the index summary level 165, the value is definitely not in the deduplication map level 166. Lookups in an index summary level 165 do not yield false negatives that would incorrectly identify that a value is not in the corresponding deduplication map level 166. In some implementations, if a value of a received data block (e.g., hash value 120 for a received data block 110) matches a partial value in the index summary level 165, information within or related to the index summary level 165 may be used to narrow the search for entries in the deduplication map level 166. Parameters for configuring an index summary level 165 may be set to trade off memory overhead or search overhead for the rate at which a lookup of a value in deduplication map level 166 will yield a false positive. The false positive rate may depend on the organization of the index summary level 165 (e.g., the number of bits used to represent an entry in the deduplication map level 166) and the distribution and number of values (e.g., keys) in the deduplication map level 166. Generating index summary levels 165 with varying false positive rates will be further described with respect to FIG. 3.

For purpose of illustration, index summary 162 illustrates the index summary levels 165A and 165B stored in volatile memory 160 of storage system 155. It may be noted that some, all, or none of the index summary levels 165 may be stored in volatile memory 160. In some implementations, the index summary levels 165 stored in volatile memory 160 or a persistent storage resource 170 may change or otherwise be altered. In some implementations, index pyramid 161 may refer to a specific layering of multiple data structures, such as index summary levels 165. A layer or level of index pyramid 161 may refer a specific index summary level 165. The index pyramid 161 may include the aggregate of all index summary levels 165 associated with storage system 155. The index pyramid 161 may be stored in persistent storage resource 170. As noted above, index summary levels 165 correspond to particular deduplication map levels 166, and may be derived at least in part using the corresponding deduplication map levels 166 or associated data 164 is persistent storage resource 170. For example, index summary level 165A corresponds to deduplication map level 166A, and index summary level 165B corresponds to deduplication map level 166A, and so forth. In some implementations, similar as described above with respect to deduplication map levels 166, newer entries (e.g., entries of the index summary level 165 that may correspond to entries in a particular deduplication map level 166) may be stored at higher levels of the index pyramid 161, and older entries are stored at lower levels of the deduplication map pyramid 171. The highest entry or group of highest entries (in one more index summary levels 165) may be referred to as the "top" of the index pyramid 161. The lowest entry or group of lowest entries may be referred to as the "bottom" of the index pyramid 161. Similar as described above with respect to deduplication map levels 166, the temporal order of index summary levels 165 may be determined by a time order of writes or a time order of deduplication in background deduplication or combination of both, in some implementations.

It may be noted that index summary 162 is illustrated as a portion 161A (e.g., shaded portion) of the index pyramid 161. The portion 161A of index pyramid 161, such as index summary 162, may be stored in volatile memory 160 while the index pyramid 161 (including portion 161A) may be stored in persistent storage resource 170. It may be noted that when storage system 155 scales in size, the size of index summary 162 may remain relatively constant and the existing size of volatile memory 160 may also remain constant, thus saving clients from purchasing additional and expensive volatile memory 160. It may also be noted that deduplication map 163 may correspond to a portion 171A (e.g., shaded) of deduplication map pyramid 171. Deduplication map 163 is illustrated as being stored in volatile memory 160 while deduplication map pyramid 171 (including portion 171A) may be stored in persistent storage resource 170. It may be noted that although an index summary level 165 may correspond to a particular deduplication map level 166, both the index summary level 165 and the corresponding deduplication map level 166 may not be stored in volatile memory 160.

It may be noted that a "hit" may refer to finding requested data in a particular data structure or electronic device. For example, using a hash value 120 to find a partial match to a partial hash value in an index summary level 165 may be a hit in the index summary level 165. Similarly, using a partial value in an index summary level 165 that partially matches a complete value in corresponding deduplication map level 166 may be a hit in the deduplication map level 166. A failure to find even a partial match to requested data in a particular data structure or electronic device may be referred to as a "miss."

Figure 2:
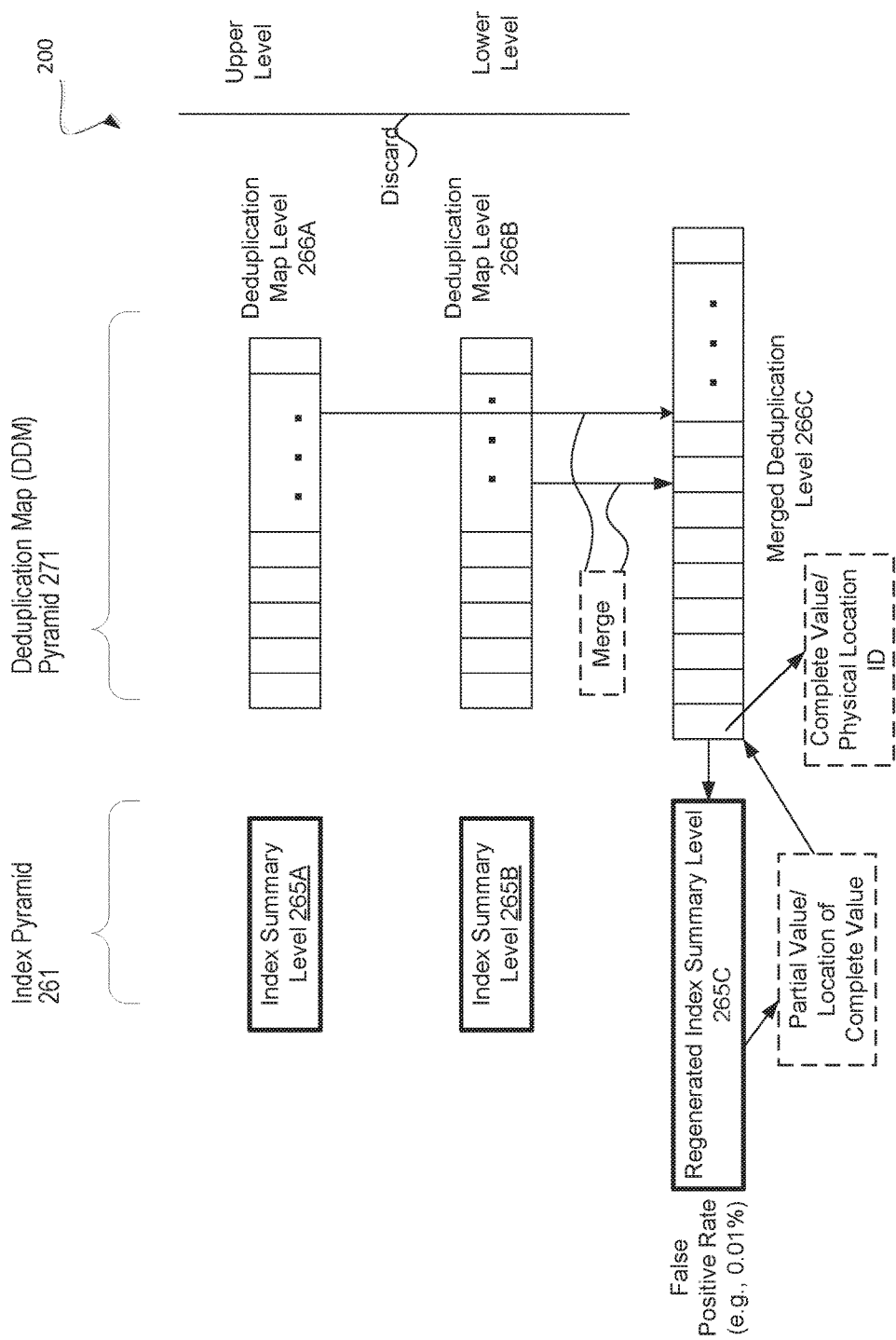
FIG. 2 illustrates an example use of merging deduplication map levels and generating corresponding index summary levels, in accordance with some implementations.

In some implementations, merge module 182 may be implemented to merge two or more deduplication map levels 166 and create a new index summary level 165 for the merged deduplication map levels 166, as will be further described with respect to at least FIG. 2. In other implementations, false positive rate module 181 may be implemented to generate index summary levels 165 with varying false positive rates, as will be further described with respect to at least FIG. 3.

Although aspects of the present disclosure relate to inline data deduplication, the disclosure herein may be applied to background (e.g., post-processing) data deduplication that may be used to analyze data blocks currently stored on a persistent storage resource 170. It may be noted that although aspects of the present disclosure relate to data deduplication, the disclosure herein may be applied to applications or systems other than data deduplication. For example, data structures, such as index summary levels 165 and deduplication map level 166, may be applied to other forms of multi-level tables that contain evenly distributed keys (or has functions that produce even distribution) and values associated with the keys.

FIG. 2 illustrates an example use of merging deduplication map levels and generating corresponding index summary levels, in accordance with some implementations. Merging process 200 may include elements with similar features as described with respect to FIG. 1. For instance, index pyramid 261 may be similar to index pyramid 161, index summary levels 265 may be similar to index summary levels 165, deduplication map pyramid 271 may be similar to deduplication map pyramid 171, and so forth. For purposes of illustration, elements of FIG. 1 may be included in the description of FIG. 2. Merging process 200 may be performed all or in part by merge module 182 as described with respect to FIG. 1.

In some implementations, to reduce the number of deduplication map levels 266 that are to be searched for data deduplication, from time to time multiple deduplication map levels 266 may be merged in a process also referred to as "flattening" herein. In some implementations, merging may be implemented by performing a sort merge of multiple adjacent deduplication map levels 266A-B to generate a new deduplication map level 266C. The merged deduplication map level 266C may replace deduplication map levels 266A-B and may represent all the entries of the deduplication map levels 266A-B. In some implementations, the merging process 200 may identify data blocks that have been overwritten, deleted, or moved or are otherwise no longer worth storing, and discard the corresponding entries in the merged deduplication map level 266C. In some implementations, merging process 200 may detect two or more deduplication map levels 266 encoded with the same values (e.g., hash values) but pointing to different data blocks stored in persistent storage resource 170, such as in cases where data deduplication failed to detect duplicate data blocks. Merging process 200 may keep duplicate values encoded in different deduplication map level 266 or discard the older of the duplicate values, for example. It may be noted that two or more deduplication map levels 266 may be merged.

In some implementations, a sort merge combines multiple sorted levels into a single sorted level by performing a linear scan of each level, one element at a time. At any given point, the sort merge considers the "next" element on each level, and selects the "comparatively lesser" element. If there are multiple elements that are considered identical, the algorithm may decide to discard all but the newest element, or use a different heuristic to identify the element to keep. Since each level being merged is already sorted, the resulting merged level is also sorted in the same way.

Each time deduplication map levels 266 are merged, a new index summary level 265C may be generated. In some implementations, generating a new index summary level 265C presents an opportunity to choose new parameters for the new index summary level 265C and tailor the false positive rate of the new index summary level 265, as will be described with respect to FIG. 3.

Merging process 200 illustrates the merging of deduplication map level 266A and deduplication map level 266B into a single deduplication map level 266C. A new index summary level 265C may be generated that corresponds to the merged deduplication map level 266C. In some implementations, after generating merged deduplication map level 266C deduplication map level 266A-B and index summary level 265A-B may be discarded, by garbage collection or another process. It may be noted that in some implementations, index summary level 265C may include a partial value, such as a partial hash value, and/or include a location of the complete value (e.g., hash value) in the corresponding deduplication map level 266C. The location in deduplication map level 266C may be searched for the complete value, and the entry containing the complete value may point to the physical location of the corresponding data block in persistent storage resource 170.

In some implementations, the new index summary level 265C may be used like other index summary levels described herein. For example, index summary level 265C may be used for data deduplication, such as inline data deduplication. A data block 110 may be received, and a hash value 120 may be generated for the data block 110. The hash value 120 may be compared to the partial hash values of index summary level 265C. If a match is determined, index summary level 265C may be used to determine a location in deduplication map level 266C to search for the complete hash value. The hash value 120 of data block 110 may be compared to the complete hash values in the determined location, identified by index summary level 265C in deduplication map level 266C. If a match is determined in deduplication map level 266C, storage system 155 may determine that the received data block 110 is duplicate data.

It may be noted that merging process 200 may push much of deduplication map content into large deduplication map levels 266 toward the bottom of deduplication map pyramid 271. A majority of the deduplication map levels 266 in deduplication map pyramid 271 may be small or moderate in size. For example, deduplication map levels 166 may accumulate batches of 10,000 entries. Once a number of such deduplication map levels 266 accumulate, the deduplication map levels 266 may be merged into a deduplication map level 266 with 50,000 entries. As the deduplication map levels 266 with 50,000 entries accumulate, the deduplication map levels 266 with 50,000 entries may be further merged to create a deduplication map level 266 with 200,000 entries, and so forth until the bottom deduplication map levels 266 of the deduplication map pyramid 271 have billions, tens of billions, or hundreds of billions of entries each, for example.

Figure 3:
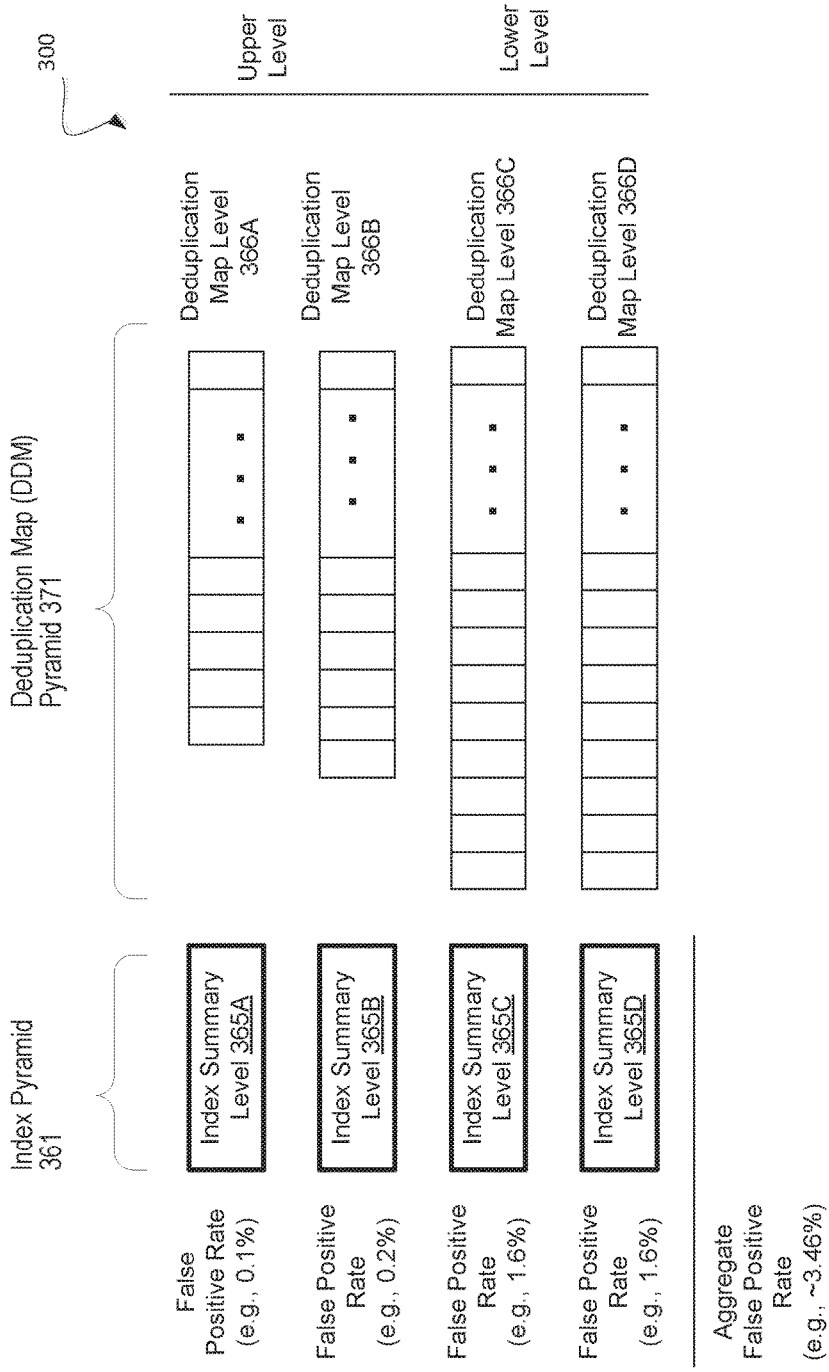
FIG. 3 illustrates an example use of generating index summary levels with varying false-positive rates, in accordance with some implementations.

FIG. 3 illustrates an example use of generating index summary levels with varying false positive rates, in accordance with some implementations. False positive rate process 300 may include elements with similar features as described with respect to FIG. 1. For instance, index pyramid 361 may be similar to index pyramid 161, index summary levels 365 may be similar to index summary levels 165, deduplication map pyramid 371 may be similar to deduplication map pyramid 171, and so forth. For purposes of illustration, elements of FIG. 1 may be included in the description of FIG. 2. False positive rate process 300 may be performed all or in part by false positive rate module 181 described with respect to FIG. 1.

In some implementations, in response to generating a new deduplication map level 366, by for example merging of two deduplication map levels 366 or generating an original deduplication map level 366 from other than merged deduplication map levels, a new corresponding index summary level 365 may also be generated. Generating a new index summary level 365 provides an opportunity to generate an index summary level 365 with a new false positive rate. For example, index summary level 365A is generated to have a false positive rate of 0.1% for lookups into corresponding deduplication map level 366A. Index summary level 365B is generated to have a false positive rate of 0.2% for lookups into corresponding deduplication map level 366B. Index summary level 365C is generated to have a false positive rate of 1.6% for lookups into corresponding deduplication map level 366C. Index summary level 365D is generated to have a false positive rate of 1.6% for lookups into corresponding deduplication map level 366D.

In some implementations, smaller false positive rates may be used to generate index summary levels 365 towards the top and middle of the index pyramid 361, which tend to have fewer entries and be smaller in size. Larger false positive rates may be used to generate index summary levels 365 towards the bottom of index pyramid 361, which tend to have more entries and be larger in size. It may be noted that since the number of entries in index summary levels 365 at the top and middle of index pyramid 361 are fewer, the index summary levels 365 at the top and middle of the index pyramid 361 may achieve a very low false positive rate and have a total size (e.g., number of bits) much smaller than index summary levels 365 towards the bottom of index pyramid 361 having the same or higher false positive rates.

In some implementations, new parameters for the new index summary levels 365 may be chosen to help adjust the false positive rate for a particular index summary level 365. Generally, an entry of an index summary level 365 corresponds to an entry in the deduplication map level 366, and a smaller number of bits per entry of an index summary level 365 represent a larger number of bits per entry in the deduplication map level 366. The false positive rate of a deduplication map level 366 may be adjusted, for example, by changing the number of bits per entry of the index summary level 365. For example, for every bit added to an entry of an index summary level 365, the false positive rate for the index summary level 365 may be decreased by a factor of two. Different parameters associated with the structure of an index summary level 365 may be adjusted (e.g., prefix table, entries per bucket, etc.) to adjust the number of bits per entry of an index summary level 365, and to achieve a specific false positive rate for a particular index summary level 365. Different parameters of an index summary level 365 are further described with respect to FIG. 5.

In some implementations, the aggregate false positive rate across all index summary levels 365 may be based on the false positive rate for each index summary level 365. The aggregate false positive rate may increase as the number of index summary levels 365 increases. In one example, an estimate of the aggregate false positive rate is:

1−[(1−(false positive rate (FPR) of index summary level i))×(1−(FPR of IS level i+1))×(1−(FPR of IS level i+2)) . . . ].

For example, with 4 index summary levels at a false positive rate of 0.1%, 3 index summary levels at false positive rate of 0.2%, 2 levels at a false positive rate of 0.6%, and 2 index summary levels at a false positive rate of 1.6%, the aggregate false positive rate is roughly 5.4%. If instead all index summary levels were identically configured to each achieve a 0.1% false positive rate, the required total size for all index summary levels in an index pyramid 361 might be 3 or 4 times larger, or if all index summary levels were configured for a 1.6% false positive rate, the aggregate false positive rate would be roughly 16%, which renders the index summary levels much less useful in, for example, performing data deduplication.

In another example, 10 levels, each with 0.1% false positive rate, may result in an aggregate false positive rate of about 1%. When combined with a single large index summary level that has a false positive rate of 1.5%, the overall false positive rate may be 2.5%, which is still an acceptable value. If a lower rate is desired, the upper index summary levels may be further reduced to 0.01% false positive rate at relatively low memory cost because the index summary levels are small. In such a scenario, the large majority of false positives will be directed to the lowest, largest index summary level, with few false positives to anywhere else in the system.

In some implementations, the actual false positive rate is probabilistic, and is based on both the specific partial hash values stored in the index summary level and the sizes of the partial hash values, and the actual incoming complete hash values that match against the partial hash values but fail to match against the complete hash values from the deduplication map levels. For example, if a partial hash value encodes 20 bits of the complete hash value, then any random 128 bit hash value has approximately a 1 in 1 million chance of being a hit. If there are 10,000 entries in total, then 1 in 100 end up being a hit, for a 1% hit rate. The hit rate is nearly identical to the false positive hit rate, since the vast majority of complete hash values don't match after the first 20 bits. For a given number of entries, reducing the false hit rate by a factor of 16 (going from 1.6% to 0.1%) may use 4 more bits of encoded signature. The index summary level model may imply the first 10 to 20 bits for example, without explicitly storing them, or with fewer stored bits than encoded bits. In some examples, a high false hit rate might end up being 8 to 10 bits of actually stored bits per entry, while a low false hit rate might require 12 to 16 stored bits per entry.

In some implementations, after a deduplication map level 366D of deduplication map pyramid 371 is generated, a false positive rate target for corresponding index summary level 365D may be determined. A false positive rate target may be a goal or target for a false positive rate for a particular index summary level 365. After the false positive rate is determined, index summary level 365D may be generated with a false positive rate that meets or is lower than the false positive rate target. In another implementation, another deduplication map level 366B is generated and another false positive rate target is determined for index summary level 365B. After determining the false positive rate target for index summary level 365B, index summary level 365B is generated with a false positive rate that meets or is lower than the false positive rate target for index summary level 365B. The false positive rate for index summary level 365D may be different than the false positive rate for index summary level 365B, for example. In some implementations, the false positive rate target may be determined based on a memory footprint of the corresponding index summary level 365 and the aggregate false positive rate for the index pyramid 361. The memory footprint may refer to the size (e.g., number of bits) of an index summary level 365 and whether the index summary level 365 is to be stored in volatile memory 160 or outside volatile memory 160. An aggregate false positive rate target may be a goal or target for the aggregate false positive rate for the index pyramid 361In some implementations, an aggregate false positive rate may be the allowed false positive rate for the index summary levels that are kept in memory, or that are otherwise likely to be searched for inline rather than for background deduplication. The aggregate false positive rate target may be set by an administrator or designer, or may change in response to different false positive rate policies, for example.

In other implementations, multiple aggregate false positive target rates may be implemented. For example, the system may have one aggregate false positive rate target for a set of smaller index summary levels near the top of the index pyramid 361, and a second aggregate false positive rate target for the one or two larger index summary levels at the bottom of the index pyramid 361.

In some implementations, determining the false positive rate target based on a memory footprint of the corresponding index summary level 365 and the aggregate false positive rate for the index pyramid 361 may be determined using a number of factors. The factors may include, but are not limited to, estimated size of the index summary level 365, the location index summary level 365 is to be stored (e.g., in or outside volatile memory 160), and the aggregate false positive rate for the index pyramid 361.

For example, the size of index summary level 365 may be an indication of the total size of an index summary level 365 given a particular number of bits per entry for the index summary level 365. The size of the index summary level 365 may give an indication of the memory impact on volatile memory 160 or persistent storage resource 170 (e.g., memory space to store the index summary level 365 of a particular size). The location the index summary level 365 is to be stored (whether inside or outside volatile memory 160) may be determined from the size of the index summary level 165 (e.g., smaller sized index summary level 365 may be preferred to be stored in volatile memory 160 over larger sized index summary levels 365, or the index summary level 365 may not fit in the allocated space of the volatile memory 160, for example). The location that the index summary level 365 is to be stored may also be determined from the temporal order of the index summary level 365 (e.g., newer index summary levels may be preferred to be stored in volatile memory 160 over older sized index summary levels 365). After storage system 155 determines the location index summary level 365 is to be stored, a false positive rate target range may be assigned to the index summary level 365. The false positive rate target range may indicate a range of false positive rate targets for a particular index summary level 165. For example, an index summary level 365 that is determined to be stored in volatile memory 160 may be given a low false positive rate target range (e.g., 0.01%-0.2%), while index summary levels 365 determined not to be stored in volatile memory 160 may be given a higher false positive rate target range (e.g., 1%-2%), for example. The false positive rate target of a particular index summary level 365 may be adjusted within the false positive rate target range so that the aggregate false positive rate for the index pyramid 361 (including index summary level 365A) stays below or equal to the aggregate false positive rate target. After the false positive rate target for index summary level 365 is determined, a bit size per entry or other parameters of the index summary level 365 may be determined to achieve the false positive rate target, and the index summary level 365 may be generated with the determined bit size and parameters and have a false positive rate that meets or is lower than the false positive rate target. It may be noted that the example above is provided for illustration, rather than limitation. It may be further noted that the above factors, as well as additional or fewer factors, may be used to determine a false positive rate target for a particular index summary level 365. It is also noted that the above factors or additional factors may be used in different ways or combinations to determine the false positive rate target for an index summary level 365 based on the memory footprint and aggregate false positive rate.

In some implementations, the actual false positive rate may be probabilistic, and may be based on both the specific partial hash values stored in the index summary level and their sizes, and the actual incoming complete hash values (e.g., data blocks 110) that match against the partial hash values in the index summary levels but fail to match against the complete hash values from the deduplication map levels. For example, if a partial hash value encodes 20 bits of the real hash value, then any random 128 bit hash value has a 1 in 1 million (roughly) chance of being a hit. If there are 10,000 entries in total (e.g., in an index summary level or index summary), then 1 in 100 end up being a hit, for a 1% hit rate. The hit rate is nearly identical to the false positive hit rate, since the vast majority of complete hash values don't match after the first 20 bits. In some implementations, for a given number of entries in an index summary level, reducing the false hit rate by a factor of 16 (going from 1.6% to 0.1%) requires 4 more bits of encoded signature. In implementations, index summary levels can imply the first, say, 10 to 20 bits (e.g., of a complete or partial hash value) without explicitly storing them, or with fewer stored bits than encoded bits. In some examples, a high false hit rate might end up being 8 to 10 bits of actually stored bits per entry, while a low false hit rate might require 12 to 16 stored bits per entry.

In some implementations, a size of index summary level 365 (e.g., total bit size) may be estimated based on the size of the corresponding deduplication map level 366. As noted above, the number of entries in a deduplication map level 366 corresponds to the number of entries in an index summary level 365. The size of index summary level 365 may be estimated by knowing the bit size per entry of the index summary level 365 and the total number of entries in the index summary level 365. Multiple estimates of the size for index summary level 365 may be determined using different bit sizes per entry of the index summary level 365.

Figure 4:
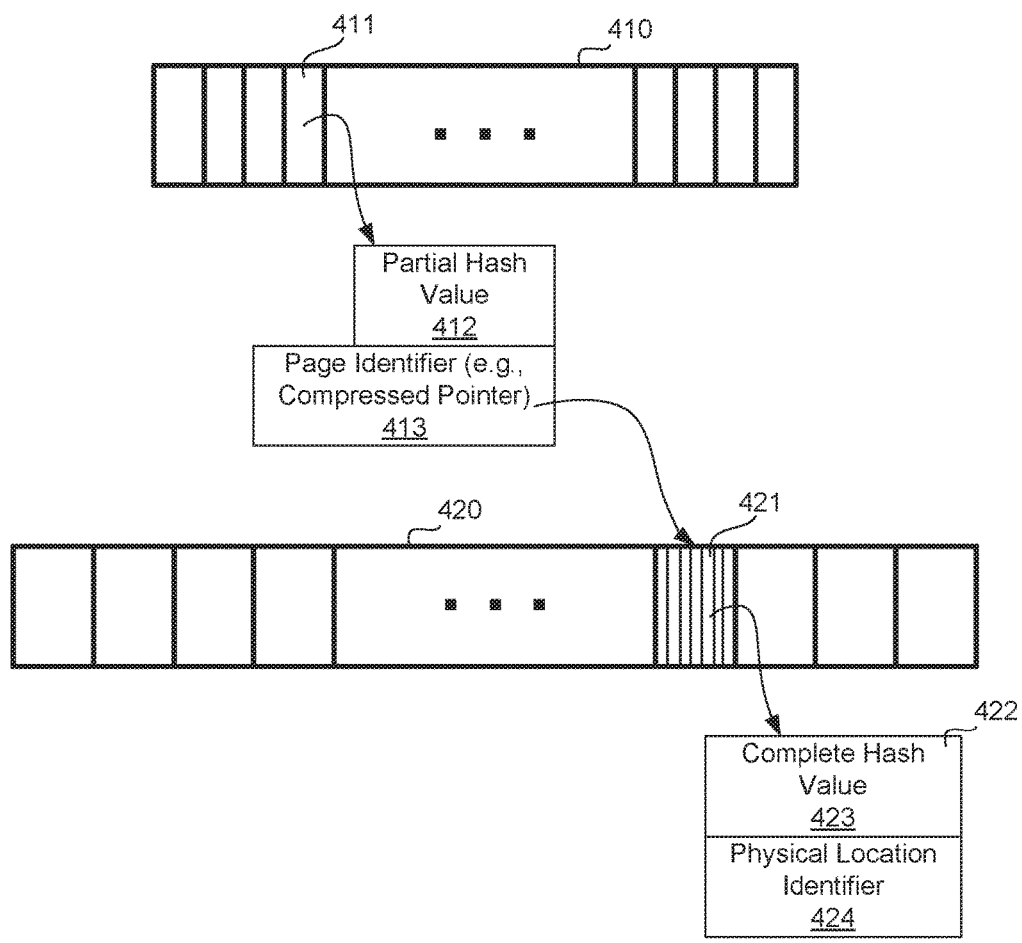
FIG. 4 illustrates an example use of an index summary level, in accordance with some implementations.

FIG. 4 illustrates an example use of an index summary, in accordance with some implementations. In one implementation, a first data structure, such as an index summary level 410, may be part of an index summary, such as index summary 162 with respect to FIG. 1. It may be noted that, for purposes of illustration, elements described with respect to FIG. 1 may be referenced herein. Index summary level 410 may be used to identify a part of a value in a second data structure, such as a deduplication map level 420. In one implementation, index summary level 410 may be stored in a volatile memory 160, such as a Dynamic Random Access Memory (DRAM) (e.g., a cache of a computing system or a storage controller of a flash storage array system) and the deduplication map level 420 may be stored in the persistent storage resource 170 (e.g., an SSD). In another implementation, a deduplication map level 420 may be stored in volatile memory 160. The index summary level 410 may identify a part of a value of the deduplication map level 420. For example, the index summary level 410 may include multiple entries 411 where each entry 411 includes a partial hash value 412 and a page identifier 413 (e.g., a compressed pointer and/or prefix table, etc.) that points to a location or page in the deduplication map level 420. For instance, the entries 411 of the index summary level 410 may identify a different partial hash value 412 and possibly a different page identifier 413 that points to a different location or page in the deduplication map level 420. In some examples, the complete hash value 423 may be a 128-bit size. The partial hash value 412 may be a part of the 128 bits of the complete hash value 423 (e.g., 40 bits of the 128 bits). The deduplication map level 420 may include multiple pages 421. Each of the pages 421 may include multiple entries 422 where each entry 422 includes a complete hash value 423 and a physical location identifier 424 of a data block stored in persistent storage resource 170. Each entry 422 of the pages 421 may include a different complete hash value 423.

In operation, a data block 110 may be received to be stored at a persistent storage resource 170. In response to receiving the data block 110, a deduplication process may be performed with the data block 110 to determine whether a copy of the data block has already been stored at the persistent storage resource 170. If the data block 110 is already stored at the persistent storage resource 170, then the data block 110 may be stored by creating a pointer to a physical location of the copy of the data block 110. The deduplication process may perform a hash function on the data block 110 to generate a hash value 120. A part of the hash value 120 may be compared with the partial hash values 412 that are stored in the index summary level 410.

If the part of the hash value 120 does not match with any of the partial hash values 412 currently stored in the index summary level 410 (or other index summary levels 165 of index summary 162), then a copy of the received data block 110 may not already be stored in the persistent storage resource 170. As such, the received data block 110 may be stored in the persistent storage resource 170, and the index summary level 410 and the deduplication map level 420 may be updated or recreated to register the received data block 110. For example, an entry 422 of the deduplication map level 420 may be modified to include the hash value 120 of the data block 110 and a physical location identifier 424 of the data block 110. Otherwise, if the part of the hash value 120 matches with a partial hash value 412 that is stored in the index summary level 410, then the corresponding page 421 of the deduplication map level 420 that is identified by the page identifier 413 of the entry 411 with the matching partial hash value 412 may be retrieved. Each entry 422 in the page 421 may be searched to determine whether the hash value 120 of the data block 110 is currently included in one of the entries 422 of the page 421. If the hash value 120 of the received data block 110 is not included in one of the entries 422, then a copy of the data block 110 may not currently be stored in the persistent storage resource 170. The data block 110 may be stored in the persistent storage resource 170, an entry 422 of the deduplication map level 420 may be modified to register the data block 110 by including the hash value 120 of the data block 110 and the physical location in the persistent storage resource 170 where the data block 110 has been stored. The corresponding index summary level 165 may also be modified. Otherwise, if the hash value 120 of the received data block 110 is included in one of the entries 422 of the deduplication map level 420, then the received data block 110 may be a duplicate or a copy of another data block. The contents of the received data block 110 may not be stored in the persistent storage resource 170 and the received data block 110 may be stored as a pointer to the physical location (e.g., physical location identifier 424) identified by the entry 422 that includes the matching complete hash value 423 of the other data block.

Figure 5:
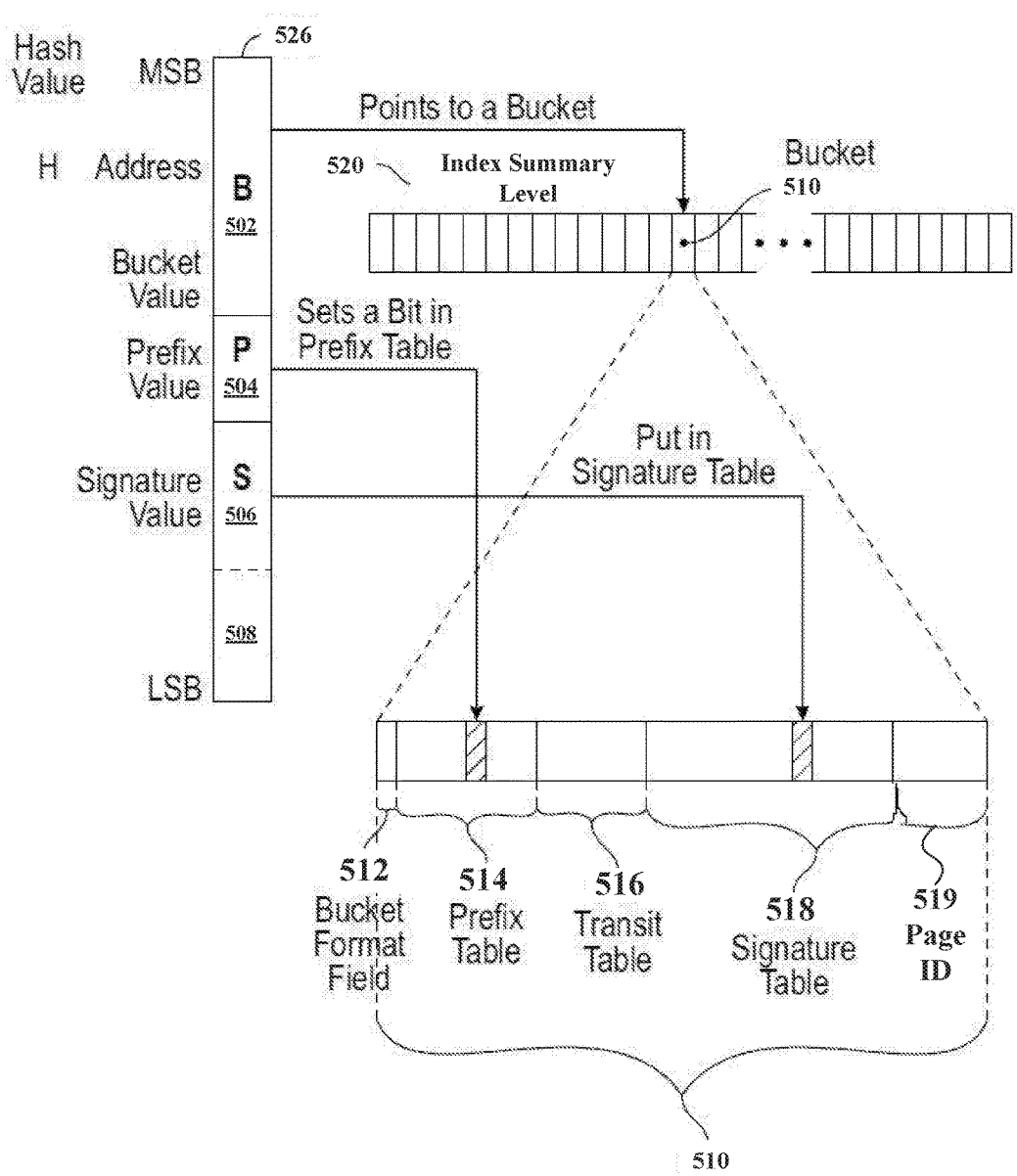
FIG. 5 illustrates an example use of an index summary level, in accordance with other implementations.

FIG. 5 illustrates an example use of an index summary level, in accordance with other implementations. Index summary level 520 includes buckets 510, each of which encodes multiple hash values 526 from the deduplication map level, such as deduplication map level 166 of FIG. 1. To construct the index summary level 520, each hash value 526 of a corresponding deduplication map level is decomposed into multiple bit fields 502, 504, and 506. These bit fields 502, 504, 506 could be rearranged and have various sizes (i.e., numbers of bits) in various implementations. The bucket address field 502 of the hash value 526 has multiple bits which are interpreted as a bucket address value, and which points to a bucket 510. In other words, the bucket address field 502 acts as an address of a bucket 510 in the index summary level 520. It may be noted that the bucket address field and associated value is taken from the most significant bits (MSB) of the hash value 526 in some implementations. Each bucket 510 can hold, represent or index many hash values 526 that have the same bit values (i.e., bucket address value) in their respective bucket address fields 502.

The prefix field 504 of the hash value 526 has multiple bits which are interpreted as a prefix value, and which determines a bit or bits in the prefix table 514 of the bucket 510 pointed to by the bucket address value. For example, if the prefix value is a number N, the Nth bit in the prefix table 514 would be set. In a further implementation, this bit is instead cleared. It follows that there must be a number of bits in the prefix table 514 equal to two raised to the power of the number of bits in the prefix field 504. For example, if there are eight bits in the prefix field 504, there must be two hundred and fifty-six (two raised to the eighth power) bits in the prefix table 514.

The signature field 506 of the hash value 526 has multiple bits which are interpreted as a signature, and which are put in the signature table 518. Depending upon the size (i.e., total number of bits) of the bucket 510, the signature field 506 could include all of the bits of the hash value 526 left over after the bits of the bucket address field 502 and the prefix field 504 are stripped off of the hash value 526. In some implementations, the bits in a truncation field 508 could be removed, and the remaining bits used as the signature value. Signature values are placed into the signature table 518 in the same order or sequence as the sorted hash values 526 of the deduplication map level. For example, the signature value of the lowest addressed hash value 526 to be represented in the bucket 510 is placed leftmost in the signature table 518. Subsequent signature values of subsequent addressed hash values 526 are placed in subsequent locations from left to right in the signature table 518. This could be reversed, i.e., starting from right and proceeding to left, in some implementations.

The transit table 516 of the bucket 510 represents the sequence of the hash values 526 of the bucket 510. There could be as many bits in the transit table 516 as the maximum number of hash values that can be represented in the signature table 518 in some implementations. This could be the same number of bits as the maximum number of signature values accommodated by the signature table 518 in one example. It may be noted that the transit table 516 does not have to be this large and in some implementations the transit table 516 can dynamically shrink or grow for fewer or greater numbers of values. Starting with the most significant bit of the transit table 516, which corresponds to the lowest addressed hash value 526 represented in the bucket 510, this bit is automatically set to a value of one. Each less significant bit is set to a value of zero if the next higher addressed hash value 526 has the same prefix value as the preceding hash value 526, and is set to a value of one if the next higher addressed hash value 526 has a differing prefix value from the preceding hash value 526. The bit corresponding to the highest entry in the bucket is always set to one, in some implementations. These values may be reversed (exchanging zero for one and one for zero), and may be filled MSB to LSB or LSB to MSB, and further variations may be devised.

In some implementations, page identifier 519 (e.g., a compressed pointer, etc.) may be included that points to a location or page in the corresponding deduplication map level. In some implementations, prefix table 514 may be used in lieu of page identifier 519.

An example set of hash values 526 and sample encoding into a bucket 510 illustrates an implementation of the above-described mechanisms and processes. Suppose it is desired to encode the following six entries (e.g., six hash values 526 from a particular deduplication map level), which are represented in hexadecimal, where B=16, P=4, and S=8. While these may or may not be optimal parameters for an actual implementation, they serve as an example and are not meant to be limiting.

54FE3618
54FD0831
54FE4884
54FEC01D
54FE3257
54FE4882

These hash values 526 are all in the same bucket, since the top 16 bits (B=16) or four hexadecimal digits (e.g., 54FE) are used to select the bucket. Next, the least significant four bits are truncated, and only the B+P+S=28 bits are kept. The list is sorted numerically, as shown below.

54FE083
54FE325
54FE361
54FE488
54FEC01

The system then builds a summary of the prefix values for the bucket 510. In this case, the prefix field 504 (P=4 bits, to the right of the B bits) of the hash values 526 have prefix values of (e.g., from the top, downward in the list) 0, 3 (twice), 4, and C (12 in hexadecimal), so the system sets the corresponding bits, out of 16, in the prefix table (with the least significant bit rightmost or last). This yields the following, for the prefix table 514.

Prefix_table=0001 0000 0001 1001

The above shows the $C^{th}$ bit, the fourth bit, the third bit, and the zeroth bit set in the 16 bit word.

The system sets the transit table 516 of the bucket 510 starting with the entry 1, not the entry 0 (i.e., zeroth entry or initial entry), since the bit for the entry 0 is automatically the first entry (least significant bit (LSB) or rightmost bit) in the prefix table. Since entry 1 (i.e. first entry) changes prefix value from entry 0, a set bit (1) indicates a new prefix is used for this value. The second entry does not change prefix values from the first entry (e.g., both have the number 3, so a cleared bit (0) indicates the same prefix is used for this value. The third entry changes prefix values from the second entry (e.g., from the number 3 to the number 4), and a set bit (1) indicates a new prefix is used for this value. The fifth entry changes prefix values from the fourth entry (e.g., from the number 4 to the number C), and a set bit (1) indicates a new prefix is used for this value. The resultant transit bits, for the transit table 516, are shown below.

11101

In some implementations, only five bits would need to be stored, since the fourth "one" bit indicates there are no more entries in the bucket 510. Consider that each 1 in the transit table 516 "consumes" a 1 in the prefix table, and the first 1 is consumed by the start of the bucket 510. This means that, if there are w bits in the prefix table, the $w^{th}$ "one" bit in the transit table 516 corresponds to the end of the transit table 516. This also means it is not necessary to store the number of entries in the bucket 510. Some implementations perform this operation using intrinsic operations to count bits. Some implementations flip the 1s and 0s in the transit table 516 as the example is illustrative and not meant to be limiting. In addition, some implementations place bits from MSB to LSB.

The number of signature bits is determined by the number of bits allotted for the signature table 518 divided by the number of entries (representing hash values 526) in the bucket 510, taking the floor if necessary. In some implementations, the number of signature bits could be fixed by the bucket format. In the above example, the signatures (i.e., signature values from the signature field 506 of the hash values 526) are as shown below.

83 25 61 88 01

Some implementations have a bucket format field 512 in the bucket 510, while others omit the bucket format field and use a fixed format for a specific index summary level. This format could differ between index summary levels and/or levels of deduplication map levels in the deduplication map pyramid. In implementations with the bucket format field 512, these bits indicate the size of the prefix table. In the above example, there could be three table sizes: 16 bits, 32 bits, and 64 bits. This could be encoded in two bits and stored in the bucket format field, with one coding left over to indicate "64+", which means an overflowed bucket with a 64-bit prefix table. Any value after the highest encoded value might be present but not encoded in the table. It may be noted that this may lead to additional false positives, but only in proportion to the address space above the top of the last entry. In a further implementation, "64+" indicates that values above the maximum and below the minimum are potential matches.

The above example does not include the offset of values in the deduplication map level itself. One full offset may cover multiple buckets in some implementations. Variations on this could be devised, such as having one offset for 1024 buckets and a small (e.g., 3-4 bits) field containing offset from this value. This means that location information for the actual deduplication map level may be small, e.g., a few bits per bucket or less.

From the above example, and the description above regarding the prefix table 514 and the transit table 516, it is seen that the prefix value, i.e., the bits in the prefix field 504 of the hash value 526, can be inferred from a combination of the prefix table 514 and the transit table 516. It is thus not necessary to store the prefix value explicitly in the bucket 510 or any other part of the index summary level 520.

In some implementations, the false positive rate of an index summary level 520 may be determined by the "loading level" of an individual bucket (e.g., bucket 510). A single bucket can represent $2^{P+S}$ unique values. For example, if P=5 and S=6, the bucket can represent $2^{11}$=2048 different values for the 11 bits it codes. If the bucket stores 25 values, the probability that the 11 bits from a randomly-selected value match those from a value in the full table is 25/2048, or 1.22%. However, different buckets will have different numbers of hash values in them because the values are randomly assigned to individual buckets. As a result, the overall false positive rate for a hash summary depends on the likelihood of a single bucket having exactly k hash values and the false positive rate for a fixed-size bucket with exactly k hash values. Because the buckets in a given summary are a fixed-size, buckets with fewer hash values can dedicate more bits to each hash value, increasing the value of S and thus decreasing the false positive rate for that bucket. Conversely, buckets with more hash values have a smaller value for S and thus a higher false positive rate. In general, the number of bits required to represent a single value is typically between S+2 and S+3, assuming that P is set such that the number of hash values expected in one bucket (N) is between $2^{P-1}$ and $2^P$. If this is done, the false positive rate is approximately $N \times 2^{-(P+S)}$, and a single bucket will consist of approximately N×(S+2.5) bits, on average. To store X values in the hash summary requires (S+2.5)×X bits, with the number of buckets ($2^B$) selected to keep the value of N (the number of hashes per bucket, $X/2^B$) at a reasonable level (typically 16-128).

Figure 6:
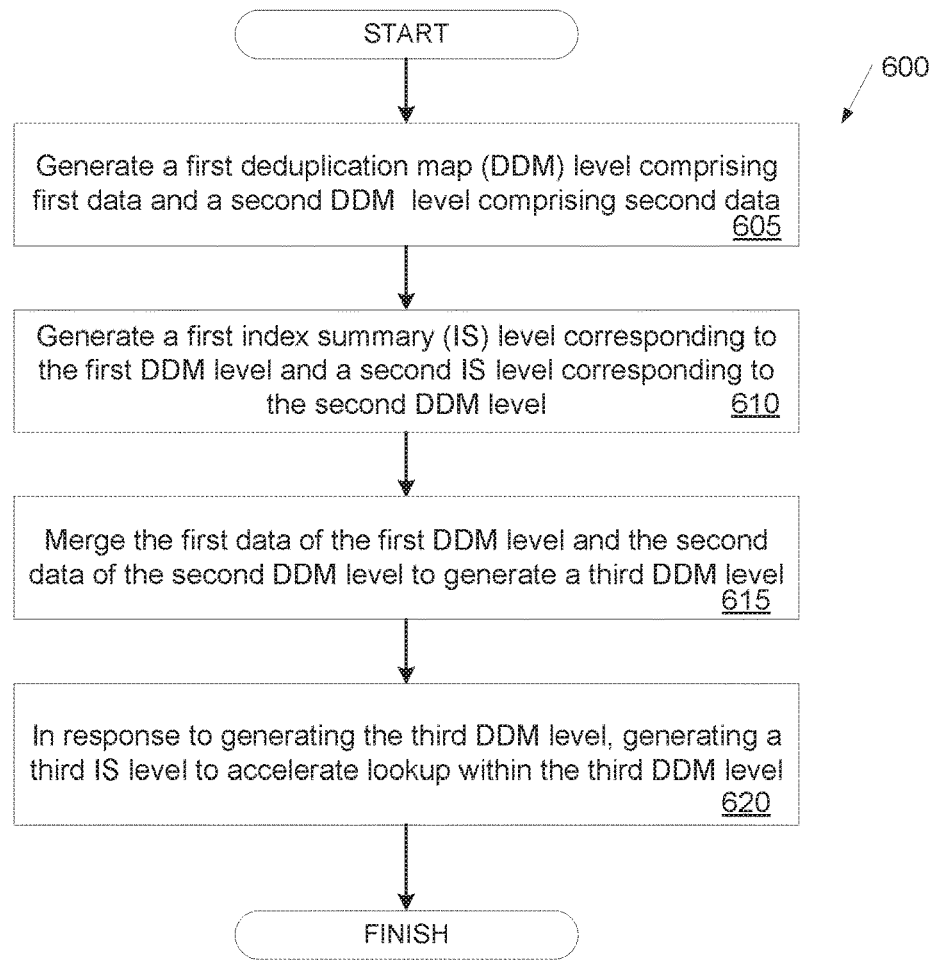
FIG. 6 a flow diagram illustrating merging deduplication map levels and generating a corresponding index summary level, in accordance with some implementations.

FIG. 6 is a flow diagram illustrating merging deduplication map levels and generating a corresponding index summary level, in accordance with some implementations. Method 600 may be performed by processing logic that includes hardware (e.g., circuitry, dedicated logic, programmable logic, microcode), software (e.g., instructions run on a processing device to perform hardware simulation), or a combination thereof. In one implementation, some or all the operations of data eviction in data deduplication system may be performed by merge module 182 as described herein.

At block 605, processing logic generates a first deduplication map (DDM) level including first data and a second DDM level including second data. At block 610, processing logic generates a first index summary (IS) level corresponding to the first DDM level and a second IS level corresponding to the second DDM level. The first IS level accelerates lookup within the first DDM level and the second IS level accelerates lookup within the second DDM level. At block 615, processing logic merges the first data of the first DDM level and the second data of the second DDM level to generate a third DDM level that includes third data. At block 620, processing logic in response to generating the third DDM level, generates a third IS level to accelerate lookup within the third DDM level. The third IS level comprises a value used to derive multiple bits in the third DDM.

Figure 7:
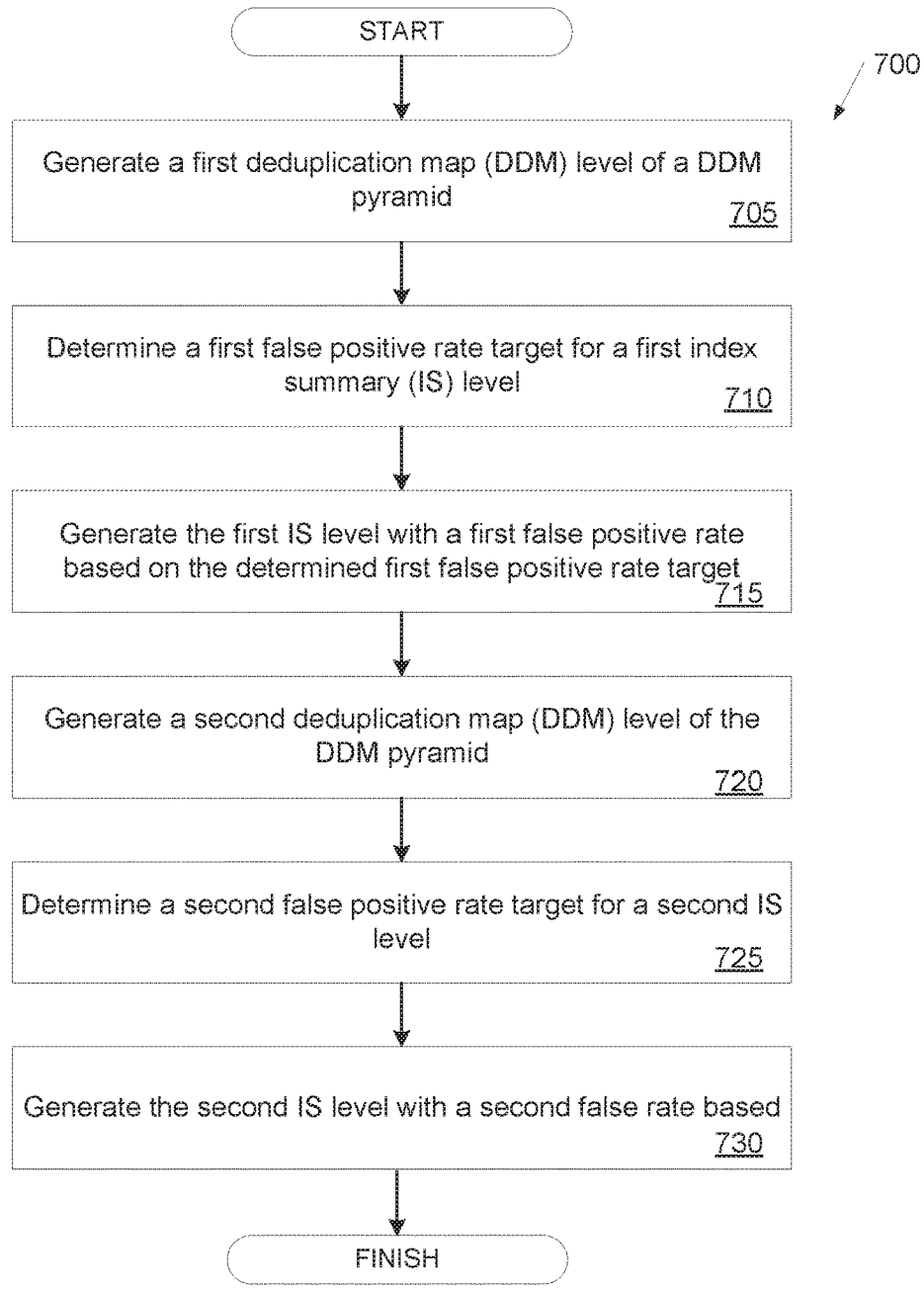
FIG. 7 a flow diagram illustrating generating index summary levels with varying false positive rates, in accordance with some implementations.

FIG. 7 a flow diagram illustrating generating index summary levels with varying false positive rates, in accordance with some implementations. Method 700 may be performed by processing logic that includes hardware (e.g., circuitry, dedicated logic, programmable logic, microcode), software (e.g., instructions run on a processing device to perform hardware simulation), or a combination thereof. In one implementation, some or all the operations of data eviction in data deduplication system may be performed by false positive rate module 181 as described herein.

At block 705, processing logic generates a first deduplication map (DDM) level of a DDM pyramid. The DDM pyramid identifies locations of data stored in the persistent storage resource of the deduplication system. At block 710, processing logic determines a first false positive rate target for a first index summary (IS) level of an index pyramid based on a memory footprint for the first IS level and an aggregate false positive rate target for the index pyramid. The first IS level accelerates lookup into the first DDM level and the first false positive rate target indicates a rate that a hit for a value found in the first IS level is not found in the first DDM level. At block 715, processing logic generates the first IS level with a first false positive rate based on the determined first false positive rate target. At block 720, processing logic generate a second deduplication map (DDM) level of the DDM pyramid. At block 725, processing logic determine a second false positive rate target for a second IS level of the index pyramid based on a memory footprint of the second IS level and the aggregate false positive rate target for the index pyramid. At block 730, processing logic generates the second IS level with a second false rate based on the determined second false positive rate target. The second false positive rate is different than the first false positive rate.

For simplicity of explanation, the processes of this disclosure are depicted and described as a series of acts. However, acts in accordance with this disclosure can occur in various orders and/or concurrently, and with other acts not presented and described herein. Furthermore, not all illustrated acts may be required to implement the processes in accordance with the disclosed subject matter. In addition, those skilled in the art will understand and appreciate that the processes could alternatively be represented as a series of interrelated states via a state diagram or events. Additionally, it may be noted that the processes disclosed in this specification are capable of being stored on an article of manufacture to facilitate transporting and transferring such processes to computing devices. The term "article of manufacture," as used herein, is intended to encompass a computer program accessible from a non-transitory computer-readable device or storage media.

Figure 8:
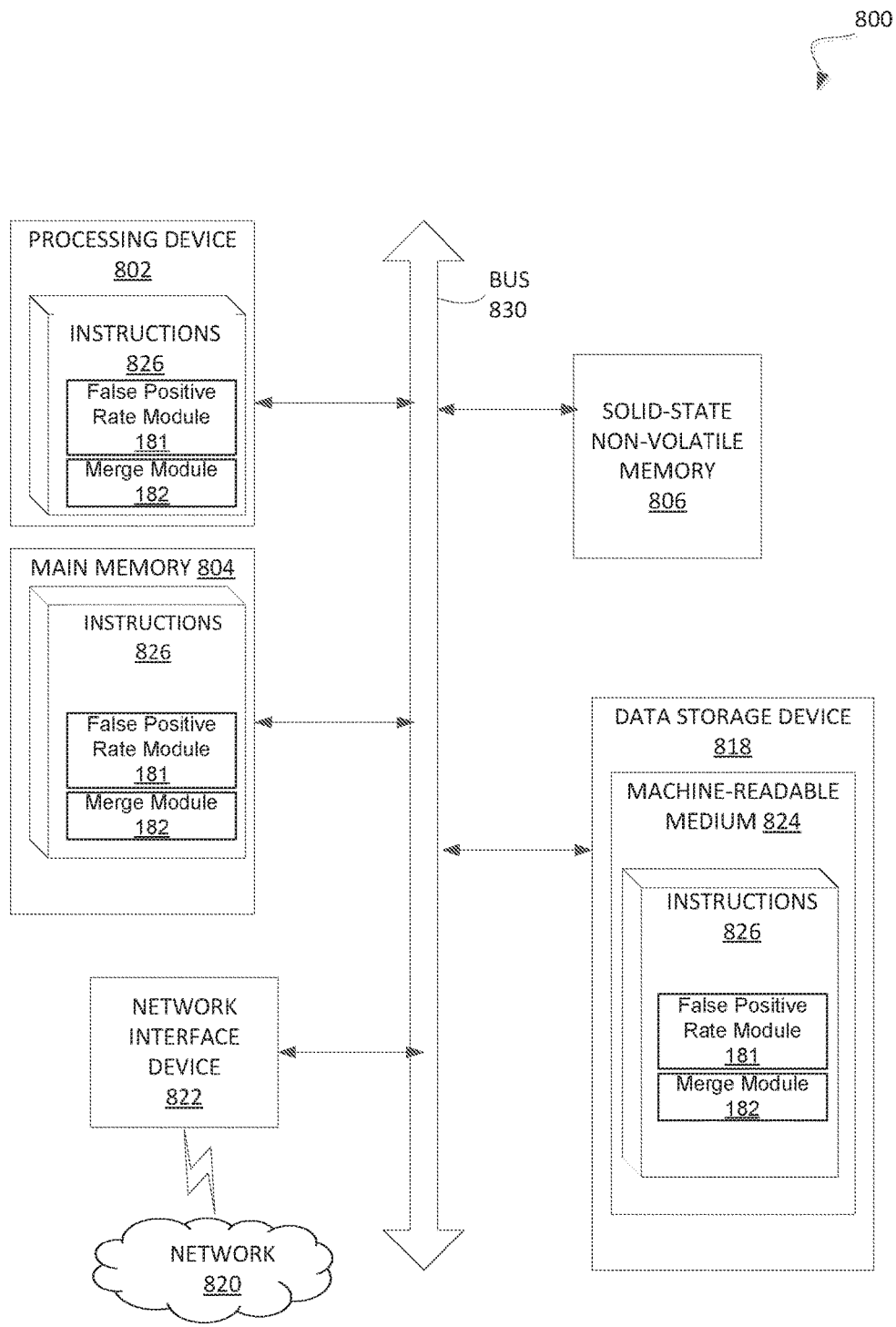
FIG. 8 illustrates an example computer system, in accordance with some implementations.

FIG. 8 depicts an example computer system 800 which can perform any one or more of the methods described herein. The computer system may be connected (e.g., networked) to other computer systems in a LAN, an intranet, an extranet, or the Internet. The computer system may operate in the capacity of a server in a client-server network environment. The computer system may be a personal computer (PC), a set-top box (STB), a server, a network router, switch or bridge, a storage system, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The exemplary computer system 800 includes a processing device 802, a main memory 804 (e.g., read-only memory (ROM), flash memory, dynamic random access memory (DRAM) such as synchronous DRAM (SDRAM)), a solid-state non-volatile memory 806 (e.g., flash memory, 3D crosspoint (XPoint) memory, magnetoresistive random-access memory (MRAM), or any other such storage media that does not use a physical disk), and a data storage device 818, which communicate with each other via a bus 808.

Processing device 802 represents one or more general-purpose processing devices such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. The processing device 802 is configured to execute a false positive rate module 181 or merge module 182 for performing any of operations and steps discussed herein. The computer system 800 may further include a network interface device 822. The data storage device 818 may include a computer-readable storage medium 824 on which is stored the false positive rate module 181 or merge module 182 embodying any one or more of the methodologies or functions described herein. The false positive rate module 181 or merge module 182 may also reside, completely or at least partially, within the main memory 804 and/or within the processing device 802 during execution thereof by the computer system 800, the main memory 804 and the processing device 802 also constituting computer-readable media. The false positive rate module 181 or merge module 182 may further be transmitted or received over a network via the network interface device 822.

While the computer-readable storage medium 824 is shown in the illustrative examples to be a single medium, the term "computer-readable storage medium" (e.g., "non-transitory computer-readable storage medium") may be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure may, therefore, be determined with reference to the appended claims, along with the full scope of equivalents to which such claims are entitled.

In the above description, numerous details are set forth. It will be apparent, however, to one skilled in the art, that the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It may be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "storing," "determining," estimating," "merging," "generating," "comparing," "discontinuing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any method for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Furthermore, the terms "first," "second," "third," "fourth," etc. as used herein are meant as labels to distinguish among different elements and may not necessarily have an ordinal meaning according to their numerical designation.

What is claimed is:

1. A deduplication system comprising:
   a persistent storage resource;
   a volatile memory; and
   a processing device, operatively coupled to the persistent storage resource and the volatile memory, to:
   generate a first deduplication map (DDM) level comprising first data and a second DDM level comprising second data;
   generate a first index summary (IS) level corresponding to the first DDM level and a second IS level corresponding to the second DDM level, wherein the first IS level accelerates lookup within the first DDM level and the second IS level accelerates lookup within the second DDM level;
   merge the first data of the first DDM level and the second data of the second DDM level to generate a third DDM level comprising third data; and
   in response to generating the third DDM level:
   generate a third IS level corresponding to the third DDM level; and
   replace the first IS level and the second IS level with the third IS level, the third IS level to accelerate lookup within the third DDM level, wherein the third IS level comprises a value used to derive a plurality of bits in the third DDM level.

2. The deduplication system of claim 1, wherein to merge the first data of the first DDM level and the second data of the second DDM level to generate the third DDM level, the processing device further to:
   perform a sort merge on the first data of the first DDM level and the second data of the second DDM level.

3. The deduplication system of claim 1, wherein the third IS level provides an indication of location of the plurality of bits in the third DDM level.

4. The deduplication system of claim 1, wherein the first data of the first DDM level and the second data of the second DDM level are evenly distributed.

5. The deduplication system of claim 1, wherein the third DDM level comprises a complete hash value of data stored in the deduplication system, wherein the third IS level comprises a partial hash value of the data stored in the deduplication system, and wherein the value of the third IS level used to derive the plurality of bits in the third DDM is the partial hash value of the data stored in the deduplication system.

6. The deduplication system of claim 1, the processing device further to:
   perform deduplication of received data using the third IS level.

7. The deduplication system of claim 6, wherein to perform the deduplication the processing device to:
   generate a hash value for the received data;
   compare the hash value for the received data to a partial hash value of the third IS level to determine a first match; and
   responsive to determining the first match exists:
   determine an indication of location in the third DDM level containing a complete hash value using the third IS level, and
   compare the hash value for the received data to the complete hash value based on the indication of location in the third DDM level to determine a second match; and
   responsive to determining the second match exists:
   determine the received data is duplicate data.

8. A non-transitory computer-readable medium to store instructions that, when executed by a processing device, cause the processing device to:
   generate a first deduplication map (DDM) level comprising first data and a second DDM level comprising second data;
   generate a first index summary (IS) level corresponding to the first DDM level and a second IS level corresponding to the second DDM level, wherein the first IS level accelerates lookup within the first DDM level and the second IS level accelerates lookup within the second DDM level;

merge the first data of the first DDM level and the second data of the second DDM level to generate a third DDM level comprising third data; and in response to generating the third DDM level:
  generate a third IS level corresponding to the third DDM level; and
  replace the first IS level and the second IS level with the third IS level, the third IS level to accelerate lookup within the third DDM level, wherein the third IS level comprises a value used to derive a plurality of bits in the third DDM level.

9. The non-transitory computer-readable medium of claim 8, wherein to merge the first data of the first DDM level and the second data of the second DDM level to generate the third DDM level, the processing device further to:
  perform a sort merge on the first data of the first DDM level and the second data of the second DDM level.

10. The non-transitory computer-readable medium of claim 8, wherein the third IS level provides an indication of location of the plurality of bits in the third DDM level.

11. The non-transitory computer-readable medium of claim 8, wherein the third DDM level comprises a complete hash value of data stored in a storage system, wherein the third IS level comprises a partial hash value of the data stored in the storage system, and wherein the value of the third IS level used to derive the plurality of bits in the third DDM is the partial hash value of the data stored in the storage system.

12. The non-transitory computer-readable medium of claim 8, the processing device further to:
  perform deduplication of received data using the third IS level.

13. The non-transitory computer-readable medium of claim 12, wherein to perform the deduplication the processing device to:
  generate a hash value for the received data;
  compare the hash value for the received data to a partial hash value of the third IS level to determine a first match; and
  responsive to determining the first match exists:
    determine an indication of location in the third DDM level containing a complete hash value using the third IS level, and
    compare the hash value for the received data to the complete hash value based on the indication of location in the third DDM level to determine a second match; and
  responsive to determining the second match exists:
    determine the received data is duplicate data.

14. A method comprising:
  generating a first deduplication map (DDM) level comprising first data and a second DDM level comprising second data;
  generating a first index summary (IS) level corresponding to the first DDM level and a second IS level corresponding to the second DDM level, wherein the first IS level accelerates lookup within the first DDM level and the second IS level accelerates lookup within the second DDM level;
  merging the first data of the first DDM level and the second data of the second DDM level to generate a third DDM level comprising third data; and
  in response to generating the third DDM level
    generating a third IS level corresponding to the third DDM level; and
    replacing the first IS level and the second IS level with the third IS level, the third IS level to accelerate lookup within the third DDM level, wherein the third IS level comprises a value used to derive a plurality of bits in the third DDM level.

15. The method of claim 14, wherein merging the first data of the first DDM level and the second data of the second DDM level to generate the third DDM level comprises:
  performing a sort merge on the first data of the first DDM level and the second data of the second DDM level.

16. The method of claim 14, wherein the third IS level provides an indication of location of the plurality of bits in the third DDM level.

17. The method of claim 14, wherein the first data of the first DDM level and the second data of the second DDM level are evenly distributed.

18. The method of claim 14, wherein the third DDM level comprises a complete hash value of data stored in a storage system, wherein the third IS level comprises a partial hash value of the data stored in the storage system, and wherein the value of the third IS level used to derive the plurality of bits in the third DDM is the partial hash value of the data stored in the storage system.

19. The method of claim 14, further comprising:
  performing deduplication of received data using the third IS level.

20. The method of claim 19, wherein performing the deduplication comprises:
  generating a hash value for the received data;
  comparing the hash value for the received data to a partial hash value of the third IS level to determine a first match; and
  responsive to determining the first match exists:
    determining an indication of location in the third DDM level containing a complete hash value using the third IS level, and
    comparing the hash value for the received data to the complete hash value based on the indication of location in the third DDM level to determine a second match; and
  responsive to determining the second match exists:
    determining the received data is duplicate data.

* * * * *